US012796389B2

(12) United States Patent
Liang et al.

(10) Patent No.: US 12,796,389 B2
(45) Date of Patent: Nov. 10, 2026

(54) METHOD AND SYSTEM OF OPTICAL NANOSCALE ALIGNMENT

(71) Applicants: INSTITUT NATIONAL DE LA RECHERCHE SCIENTIFIQUE, Quebec (CA); APPLIED NANOTOOLS INC., Edmonton (CA)

(72) Inventors: Jinyang Liang, Boucherville (CA); Siqi Wang, Lasalle (CA); Cheng Jiang, Montreal (CA); Robert Peters, Edmonton (CA)

(73) Assignees: INSTITUT NATIONAL DE LA RECHERCHE SCIENTIFIQUE, Québec (CA); APPLIED NANOTOOLS INC., Edmonton (CA)

( * ) Notice: Subject to any disclaimer, the term of this patent is extended or adjusted under 35 U.S.C. 154(b) by 99 days.

(21) Appl. No.: 18/964,169

(22) Filed: Nov. 29, 2024

(65) Prior Publication Data

US 2025/0183080 A1 Jun. 5, 2025

Related U.S. Application Data

(60) Provisional application No. 63/605,290, filed on Dec. 1, 2023.

(51) Int. Cl.
*H10P 72/50* (2026.01)
*H10W 46/00* (2026.01)

(52) U.S. Cl.
CPC ............. *H10P 72/53* (2026.01); *H10W 46/00* (2026.01); *H10W 46/301* (2026.01)

(58) Field of Classification Search
CPC ............. G03F 7/70691; G03F 7/70716; G03F 7/70725; G03F 7/70733; G03F 7/70775;
(Continued)

(56) References Cited

U.S. PATENT DOCUMENTS 9,366,786 B2 6/2016 Je et al.
2011/0007325 A1* 1/2011 Ichinose ............. G03F 7/70341 356/620

FOREIGN PATENT DOCUMENTS

CN 112053985 A * 12/2020 .......... H10P 72/0606
CN 114361014 A * 4/2022

OTHER PUBLICATIONS

J. Zhu, S. Hu, J. Yu, Y. Tang, Alignment method based on matched dual-grating moire fringe for proximity lithography. Opt. Eng. 51, 113603-113603 (2012).

(Continued)

*Primary Examiner* — Tarifur R Chowdhury
*Assistant Examiner* — Kaitlyn E Kidwell
(74) *Attorney, Agent, or Firm* — Gwendoline Bruneau; Lavery, de Billy, L.L.P.

(57) ABSTRACT

A method and a system of optical nanoscale alignment, a sample support comprises a first holder for a first chip and a second holder for a second chip; the first and second chips are positioned in a facing relationship on a first and a second surface of the sample respectively, and a dual light source casts a coherent light beam on the sample from a first surface and an incoherent beam on the sample from a second, opposite, surface thereof; a positioning unit controls the movement of the first chip and controls the movement of the second chip according to isotropic interference fringes generated by the dual light in reflection mode in images captured by an imaging unit, indicating of pitch and yaw angle, light from the dual light source in transmission mode providing bright field illumination while x, y, and rotation alignments are performed.

18 Claims, 20 Drawing Sheets

(58) Field of Classification Search
CPC ...... G03F 7/70758; G03F 9/7003; G03F 9/00; G03F 9/7023; G03F 9/7069; G03F 9/7065; G03F 9/7049; H10P 72/50; H10P 72/70; H10P 72/00; H10P 72/53; H10P 72/57; H10W 46/301; H10W 46/00
See application file for complete search history.

(56) References Cited

OTHER PUBLICATIONS

N. Li, W. Wu, S. Y. Chou, Sub-20-nm alignment in nanoimprint lithography using Moire fringe. Nano Lett. 6, 2626-2629 (2006).
A.-K. Batzer, Optical Alignment Method for Stacking High Resolution Zone Plates, Master's Thesis, KTH Royal Institute of Technology (2015).
I. Snigireva et al., Stacked Fresnel Zone Plates for High Energy X-rays, in AIP Conf. Proc., vol. 879, pp. 998-1001 (2007).
J. Zhu et al., Four-quadrant gratings moire fringe alignment measurement in proximity lithography. Opt. Express 21, 3463-3473 (2013).
Chkhalo, Nikolai I., et al. "Diffraction limited X-ray optics: technology, metrology, applications." Physics-Uspekhi 63.1 (2020): 67.
DiFabrizio et al., High-effenciency multilevel zone plates for keV X-rays, Nature, vol. 41, 28.
Haroutunyan, L., K. Trouni, and A. Kuyumchyan. "Stacked Multilevel Fresnel Zone Plates for Hard X-Rays." arXiv preprint arXiv:1210.7912 (2012).
Holt, M., et al., Nanoscale hard X-ray microscopy methods for materials studies. Annu. Rev. Mater. Res, 2013. 43(1): p. 183-211.
Tamura, Shigeharu. "Multilayer Fresnel zone plate with high-diffraction efficiency: application of composite layer to x-ray optics." Metal, Ceramic and Polymeric Composites for Various Uses. IntechOpen, 2011.
Zhou, Shaolin, et al. "Fourier-based analysis of moiré fringe patterns of superposed gratings in alignment of nanolithography." Optics express 16.11 (2008): 7869-7880.
https://www.zeiss.com/microscopy/en/products/x-ray-microscopy.html—Aug. 2023.
https://www.esrf.fr/UsersAndScience/Experiments/XNP/BM05—Aug. 2023.
A_G_Michette_X-ray microscopy _Rep._Prog._Phys._51_1525-1988.
E. H. Anderson et al., Nanofabrication and diffractive optics for high-resolution x-ray applications. J. Vac. Sci. Technol. B:Nanotechnol. Microelectron. 18, 2970-2975 (2000).
S.-R. Wu, Y. Hwu, G. Margaritondo, Hard-X-ray zone plates: recent progress. Materials 5, 1752-1773 (2012).
A. Snigirev, V. Kohn, I. Snigireva, B. Lengeler, A compound refractive lens for focusing high-energy X-rays. Nature 384, 49-51 (1996).
F. Seiboth et al., Perfect X-ray focusing via fitting corrective glasses to aberrated optics. Nat. Commun. 8, 14623 (2017).
R. J. Koch et al., Nano focusing of soft X-rays by a new capillary mirror optic. Synchrotron Radiat. News 31, 50-52 (2018).
M. A. Kumakhov, Capillary optics and their use in x-ray analysis. X-Ray Spectrom. 29, 343-348 (2000).
R. Hudec, Kirkpatrick-Baez x-ray optics: a review, in EUV and X-Ray Optics: Synergy between Laboratory and Space II, vol. 8076, pp. 62-75 (2011).
H. Mimura et al., Breaking the 10 nm barrier in hard-X-ray focusing. Nat. Phys. 6, 122-125 (2010).
R. Conley et al., Multilayer Laue lens: A brief history and current status. Synchrotron Radiat. News 29, 16-20 (2016).
S. Bajt et al., X-ray focusing with efficient high-NA multilayer Laue lenses. Light Sci. Appl. 7, 17162-17162 (2018).
V. Lider, Zone plates for X-ray focusing. J. Surf. Invest.: X-Ray, Synchrotron Neutron Tech. 11, 1113-1127 (2017).
G. E. Ice, J. D. Budai, J. W. Pang, The race to x-ray microbeam and nanobeam science. Science 334, 1234-1239 (2011).
V. V. Lider, X-ray microscopy. Physics-uspekhi 60, 187 (2017).
J. Geilhufe et al., Monolithic focused reference beam X-ray holography. Nat. Commun. 5, 3008 (2014).
S. Pascarelli, O. Mathon, M. Munoz, T. Mairs, J. Susini, Energy-dispersive absorption spectroscopy for hard-X-ray micro-XAS applications. J. Synchrotron Radiat. 13, 351-358 (2006).
H. H. Solak, Nanolithography with coherent extreme ultraviolet light. J. Phys. D 39, R171 (2006).
H. Zhang, H. Liu, W. Xu, Z. Lu, Large aperture diffractive optical telescope: A review. Opt. Laser Technol. 130, 106356 (2020).
S.-C. Gleber et al., Fresnel zone plate stacking in the intermediate field for high efficiency focusing in the hard X-ray regime. Opt. Express 22, 28142-28153 (2014).
C. Y. Hémonnot, S. Köster, Imaging of biological materials and cells by X-ray scattering and diffraction. ACS Nano 11, 8542-8559 (2017).
S. Tamura et al., New approaches to fabrication of multilayer Fresnel zone plate for high-energy synchrotron radiation X-rays. Vacuum 80, 823-827 (2006).
Y. Chen, Nanofabrication by electron beam lithography and its applications: A review. Microelectron. Eng. 135, 57-72 (2015).
U. T. Sanli et al., 3D Nanofabrication of High-Resolution Multilayer Fresnel Zone Plates. Adv. Sci. 5, 1800346 (2018).
K. Keskinbora et al., Multilayer Fresnel zone plates for high energy radiation resolve 21 nm features at 1.2 keV. Opt. Express 22, 18440-18453 (2014).
N. Kamijo et al., Microbeam of 100 keV x ray with a sputtered-sliced Fresnel zone plate. Rev. Sci. Instrum. 74, 5101-5104 (2003.
U. T. Sanli, K. Keskinbora, C. Grévent, G. Schütz, Overview of the multilayer-Fresnel zone plate and the kinoform lens development at MPI for Intelligent Systems, in EUV and X-ray Optics: Synergy between Laboratory and Space IV, vol. 9510, pp. 248-256 (2015).
M. Mayer et al., Efficient focusing of 8 keV X-rays with multilayer Fresnel zone plates fabricated by atomic layer deposition and focused ion beam milling. J. Synchrotron Radiat. 20, 433-440 (2013).
I. Mohacsi et al., Interlaced zone plate optics for hard X-ray imaging in the 10 nm range. Sci. Rep. 7, 43624 (2017).
C. Chang, A. Sakdinawat, Ultra-high aspect ratio high-resolution nanofabrication for hard X-ray diffractive optics. Nat. Commun. 5, 4243 (2014).
J. Maser et al., Near-field stacking of zone plates in the x-ray range, in Design and Microfabrication of Novel X-Ray Optics, vol. 4783, pp. 74-81 (2002).
V. Aristov et al., Study of optical properties of x-ray system based on two zone plates. Nucl. Instrum. Methods Phys. Res. A 575, 238-241 (2007).
S. Werner, S. Rehbein, P. Guttmann, S. Heim, G. Schneider, Towards high diffraction efficiency zone plates for X-ray microscopy. Microelectron. Eng. 87, 1557-1560 (2010).
S. Werner, S. Rehbein, P. Guttmann, G. Schneider, Three-dimensional structured on-chip stacked zone plates for nanoscale X-ray imaging with high efficiency. Nano Res. 7, 528-535 (2014).
V. Yurgens, F. Koch, M. Scheel, T. Weitkamp, C. David, Measurement and compensation of misalignment in double-sided hard X-ray Fresnel zone plates. J. Synchrotron Radiat. 27, 583-589 (2020).
I. Mohacsi et al., High resolution double-sided diffractive optics for hard X-ray microscopy. Opt. Express 23, 776-786 (2015).
S. Shastri, J. Maser, B. Lai, J. Tys, Microfocusing of 50 keV undulator radiation with two stacked zone plates. Opt. Commun. 197, 9-14 (2001).
K. Li, C. Jacobsen, More are better, but the details matter: combinations of multiple Fresnel zone plates for improved resolution and efficiency in x-ray microscopy. J. Synchrotron Radiat. 25, 1048-1059 (2018).
Y. Feng et al., Nanofabrication of high aspect ratio 24nm x-ray zone plates for x-ray imaging applications. J. Vac. Sci. Technol. B:Nanotechnol. Microelectron. 25, 2004-2007 (2007).
I. Snigireva et al., Hard X-ray focusing by stacked Fresnel zone plates, in Advances in X-Ray/EUV Optics and Components II, vol. 6705, pp. 117-127 (2007).

(56) References Cited

OTHER PUBLICATIONS

M. J. Wojcik et al., Stacking multiple zone plates for efficient hard x-ray focusing at the Advanced Photon Source, in X-Ray Nanoimaging: Instruments and Methods II, vol. 9592, pp. 48-56 (2015).
I. Snigireva et al., Focusing high energy X-rays with stacked Fresnel zone plates. Phys. Status Solidi A 204, 2817-2823 (2007).
K. Creath, J. Wyant, Moire and fringe projection techniques, in Optical Shop Testing. (1992), vol. 2, pp. 653-685.
M. Liu, L. Wang, G. Yu, Developing Graphene-Based Moiré Heterostructures for Twistronics. Adv. Sci. 9, 2103170 (2022).
G. Reid, Moiré fringes in metrology. Opt. Laser Eng. 5, 63-93 (1984).
W. Jiang, H. Wang, W. Xie, Z. Qu, Lithography alignment techniques based on moiré fringe. Photonics 10, 351 (2023).
C. Coltharp, J. Xiao, Superresolution microscopy for microbiology. Cell. Microbiol. 14, 1808-1818 (2012).
C. Wang, S. Taniyama, Y.-H. Wang, T. Suga, High-precision alignment for low-temperature wafer bonding. J. Electrochem. Soc. 156, H197 (2009).
C. Wang, T. Suga, Measurement of alignment accuracy for wafer bonding by moiré method. Jpn. J. Appl. Phys. 46, 1989 (2007).
A. A. Ghazanfarian et al., Exploiting structure of wafer distortion in global alignment. J. Vac. Sci. Technol. B: Nanotechnol. Microelectron. 16, 3642-3646 (1998).
M. Mühlberger et al., A Moire method for high accuracy alignment in nanoimprint lithography. Microelectron. Eng. 84, 925-927 (2007).

* cited by examiner

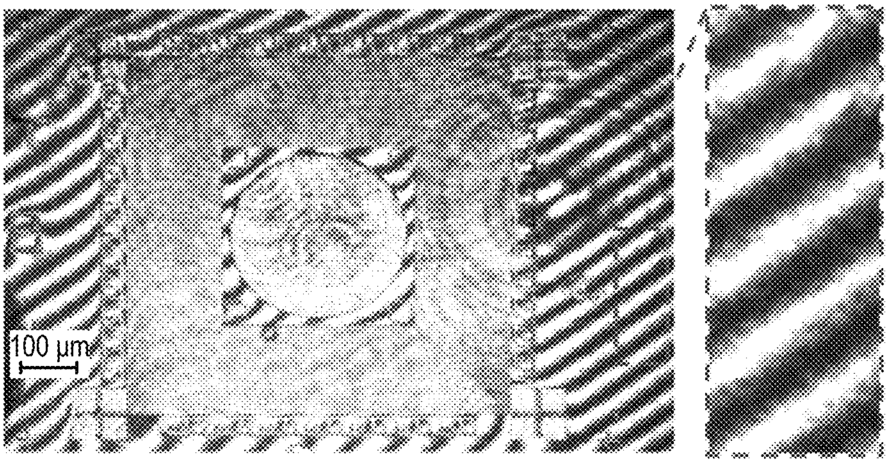
FIG. 7A
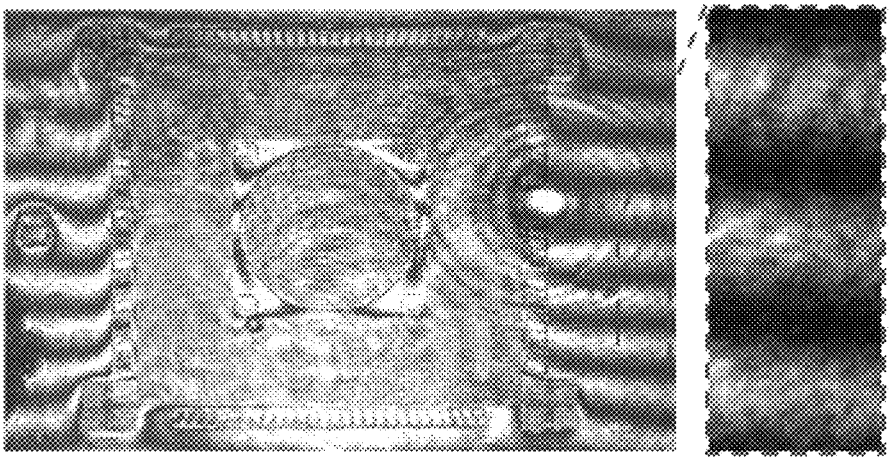
FIG. 7B
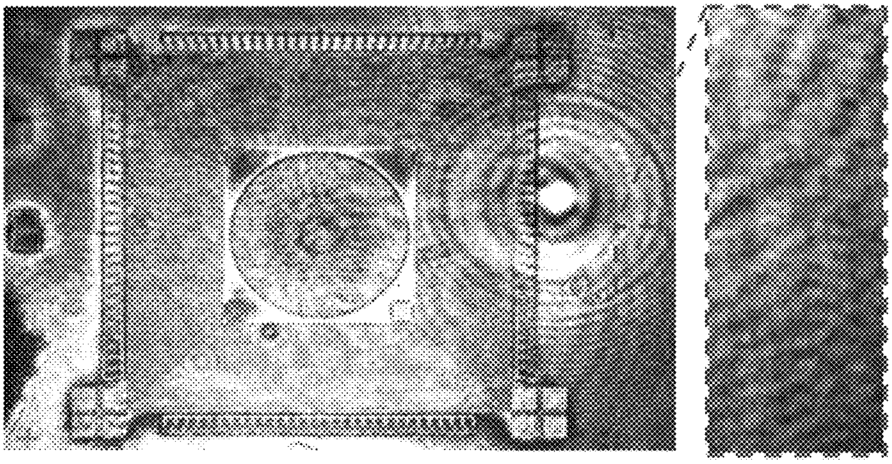
FIG. 7C

Table 1. Specifications of the grating pairs designed for the FZP chips ($j = i\ or\ o$)

| *Parameters* | *Inner area* | *Outer area* |
|---|---|---|
| Pitch of grating 1 | $P_{1i}$=2.42 μm | $P_{1o}$=2.46 μm |
| Pitch of grating 2 | $P_{2i}$=2.58 μm | $P_{2o}$=2.54 μm |
| Pitch of moiré fringes [a] | $P_{mi}$=39 μm | $P_{mo}$=78 μm |
| Magnification ratio of moiré fringes [b] | $M_{mi}$=31.25 | $M_{mo}$=62.5 |
| Measure range of moiré fringes [c] | $R_{mi} \in [-0.624, 0.624]$ μm | $R_{mo} \in [-0.624, 0.624]$ μm |

[a] $P_{mj} = P_{1j} P_{2j} / | P_{1j} - P_{2j} |$

[b] $M_{mj} = ( P_{1j} + P_{2j} ) / | P_{1j} - P_{2j} |$

[c] $R_{mj} \in 0.5 \times [ -P_{mj} / M_{mj}, P_{mj} / M_{mj} ]$

FIG. 11

Table 2. Experimentally determined mismatch in each region using moiré-fringe analysis

| | Inner area ($M_{mi} = 31.3$) | | Outer area ($M_{mo} = 62.5$) | |
|---|---|---|---|---|
| | $\Delta_i$ (μm) | $\delta_i$ (nm) | $\Delta_o$ (μm) | $\delta_o$ (nm) |
| Top | -0.34 | -2.6 | -1.92 | -7.4 |
| Bottom | 4.56 | 35.0 | 4.15 | 15.9 |
| Left | -2.9 | -22.7 | 7.44 | 28.6 |
| Right | -1.42 | -10.9 | -9.55 | -36.7 |

FIG. 12

Calculated misalignments of $x$, $y$, and rotation

| Approach \ Misalignment | | $x$ (nm) | $y$ (nm) | Rotation (μrad) |
|---|---|---|---|---|
| Vernier/Main scales | | [-500, 500] | [-500, 500] | [-1250, 1250] |
| Moiré fringes | Inner area | 16.2 | -16.8 | -29.3 |
| | Outer area | 4.3 | -4.1 | -71.5 |

FIG. 13

METHOD AND SYSTEM OF OPTICAL NANOSCALE ALIGNMENT

CROSS REFERENCE TO RELATED APPLICATIONS

This application claims benefit of U.S. provisional application Ser. No. 63,605,290, filed on Dec. 1, 2023. All documents above are incorporated herein in their entirety by reference.

FIELD OF THE INVENTION

The present invention relates to optical nanoscale alignment. More specifically, the present disclosure is concerned with a method and system of Moiré fringes based optical nanoscale alignment.

BACKGROUND OF THE INVENTION

A Fresnel zone plate (FZP) is a diffractive optical element comprising concentric rings, referred to as Fresnel zones, alternating high-Z materials (absorbing material), such as gold for example, and low-Z materials (transparent to X-rays), such as $Si_3N_4$ for example. Light hitting the zone plate diffracts around the opaque zones. The zones can be spaced so that the diffracted light constructively interferes at the desired focus, creating an image there.

FZPs are used as X-ray beam focusing or magnifying optical devices, for X-ray microscopy, X-ray holography, X-ray spectroscopy, and astronomy. High diffraction efficiency is required to minimize exposure times and hence the radiation load on the specimens under study. Increasing the thickness of the FZP grating structures, between about 0.7 and about 0.8 μm for example, significantly improves the peak diffraction efficiency and the corresponding photon energy level, in particular in the high-energy region, typically above 20 keV, due to the high penetration of hard X-ray photons. Meanwhile to maintain a high resolution of the FZP, the width of the outermost zone width is limited Currently, due to fabrication limitations of aspect ratios, high-resolution zone plates only have a peak diffraction efficiency of about 10% in the hard X-ray range. When stacking two or more FZPs to increase the thickness, an accuracy of below ⅓ outermost zone width is required in the alignment process, in order to maintain the outer zone accuracy of the stacked FZPs. A high-precision alignment system to produce stacked FZP is thus needed.

The near-field stacking technique was developed in 2007 under the X-ray imaging facilities, using the Moiré fringes method for alignment in lithography. Stacking was performed with the European Synchrotron Radiation Facility (ESRF) BM05 beamline. Alignment of the two FZPs was achieved by X-ray phase contrast imaging by looking at the high-resolution CCD camera image of the beam. Two sets of silicon chips were stacked and glued for focusing 15-KeV and 50-keV X-rays. To achieve the spatial resolution of 50 nm in the energy range 6-15 keV, longitudinal proximity in the order of 20 μm was required. Intermediate-field stacking technique, later implemented in 2014, was shown to allow stacking up to five FZPs at 10, 11.8, and 25 keV energies.

Attempts were made to stack FZPs under an optical system using laser illumination. While under X-ray, the chips with different periods of grating patterns can be put within the near field region of the fine grating, under visible light illumination, the second chip is placed at integer multiples of half the Talbot distance to minimize the loss of high-frequency information. Microbeads between the zone plates determine the gap between them to align the lateral displacement with a resolution of less than 5 nm. The alignment is done by moving the sample with manual control, showing promising possibilities for stacking two high-resolution zone plates.

Other methods to improve the diffraction efficiency of high-resolution zone plates at high energies besides the stacking technique include the sputtered-sliced FZP method and direct patterning of two identically aligned FZPs on double sides of a membrane. The sputtered-sliced Fresnel zone plate method creates a Fresnel zone plate with a small aperture, which limits its applicability. Directly patterning two identically aligned Fresnel zone plates has high technical restrictions and does not offer the possibility of increasing the thickness three or more times.

Still, when stacking zone plates, alignment remains a challenge. X-ray alignment facilities such as the ESRF BM05 beamline are accessible for leasing at the European Synchrotron Radiation Facility providing a training period. For industrial production, the price of purchasing an X-ray microscope would be over $200,000 USD, not to mention the difficulty and danger of modifying this equipment.

A method and system for stacking Fresnel zone plates (FZPs) under an optical system, accessible to a general company or a research institution is still needed. Firstly, available systems do not consider rotation misalignment. Second, microbeads are used to provide parallelism in the stack and a tedious and unstable preparation is required. Third, the alignment process is controlled manually, which compromises the operation sensitivity and the alignment accuracy. Finally, the stacked Fresnel zone plates (FZPs) are not glued, which is inconvenient for further operation.

There is still a need in the art for a method and system of optical nanoscale alignment.

SUMMARY OF THE INVENTION

More specifically, in accordance with the present invention, there is provided a system of optical nanoscale alignment, comprising a sample support comprising a first holder for a first chip, and a second holder for a second chip; the first and second chips being positioned in the respective first and second chip holders in a facing relationship on the first and second surfaces of the sample respectively, a dual light source casting a coherent light beam on a sample from a first surface and an incoherent beam on the sample from a second, opposite, surface thereof; a positioning unit controlling a movement of the first chip and controlling a movement of the second chip according to isotropic interference fringes generated by a reflection mode of the dual light source in images captured by an imaging unit, indicating of pitch and yaw angle, light from the dual light source in transmission mode providing bright field illumination while x, y, and rotation alignments are performed.

There is further provided a method of optical nanoscale alignment, comprising mounting a first chip supported by a first holder and a second chip supported by a second holder in a facing relationship on a first and a second surfaces of a sample respectively; providing a positioning unit controlling movements of the first and of the second chips respectively; illuminating the first surface of the sample using a first light beam and the second surface of the sample with a second light beam of a dual light source; capturing images of the first and second chips using an imaging unit; monitoring tilt and yaw of the chips to a misalignment of at most 0.3 mrad; monitoring x and y directions and rotation of the chips to a misalignment of ±0.5 μm in and of ±1.25 mrad respectfully; and monitoring the x and y directions and rotation of the chips to a misalignment of an outermost ring of the chips, wherein the movements of the first chip and of the second chip are controlled by the positioning unit according to isotropic interference fringes generated by a reflection mode of the dual light source in the images captured by the imaging unit, indicating of pitch and yaw angles, light from the dual light source in transmission mode providing bright field illumination while x, y, and rotation alignments are performed.

Other objects, advantages and features of the present invention will become more apparent upon reading of the following non-restrictive description of specific embodiments thereof, given by way of example only with reference to the accompanying drawings.

BRIEF DESCRIPTION OF THE DRAWINGS

In the appended drawings:

FIG. 7A shows interference fringes produced by misalignment in both tilt and yaw; FIG. 7B shows interference fringes produced by misalignment only in yaw; FIG. 7C shows interference pattern after completing the tilt-yaw alignment;

FIG. 11 is a table of specifications of the grating pairs designed for the FZP chips (j=i or o);

FIG. 12 is a table of experimentally determined mismatch in each region using moiré-fringe analysis;

FIG. 13 is a table of calculated misalignments of x, y, and rotation;

DESCRIPTION OF ILLUSTRATIVE EMBODIMENTS

The present invention is illustrated in further detail by the following non-limiting examples.

Figure 1A:
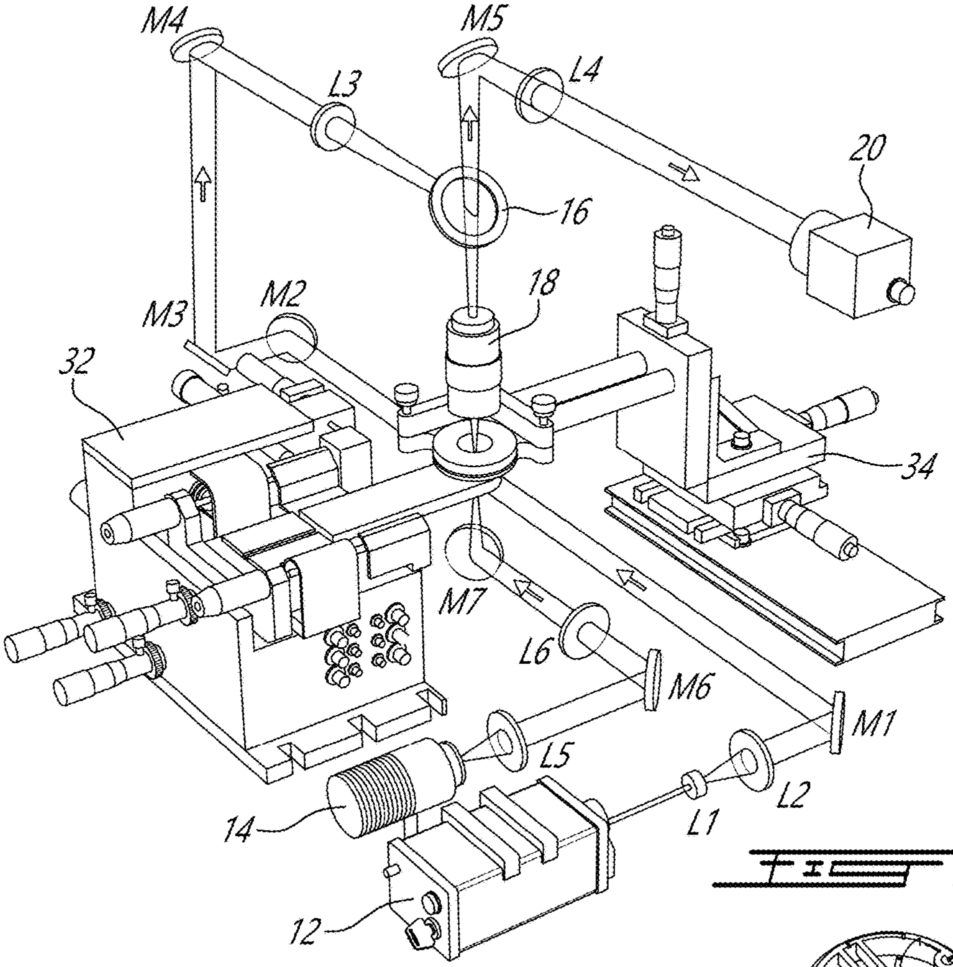
FIG. 1A is a schematic view of a system according to an embodiment of an aspect of the present disclosure.

A system according to an embodiment of an aspect of the present disclosure as illustrated in FIG. 1A comprises a dual light source, positioning stages and a sample support. L1-L5 are lenses and M1-M7 are mirrors.

Experiments 350-900 nm with a dual light source comprising a 532-nm continuous-wave laser 12 (CNI Laser, green-532-200 mw) working in reflection mode illumination and an orange-color visible mounted light emitting diode LED 14 (Thorlabs, M617L5) working in transmission mode. The green laser beam from the laser 12 is expanded and reflected by a pellicle beam splitter 16 (Thorlabs, CM1-BP145B1), collected by a 10× long working distance Mitutoyo objective lens 18 (Thorlabs, MY10X-803), and then cast on the sample O from the top, as the beam from the light emitting diode LED 14 is collimated and penetrates the sample O from the bottom; the two beams are modulated by the sample O, then collected by the objective lens 18 and the beam splitter 16, and captured by a high-resolution monochromatic camera 20 (FLIR, BFS-U3-200S6M-C).

Figure 1B:
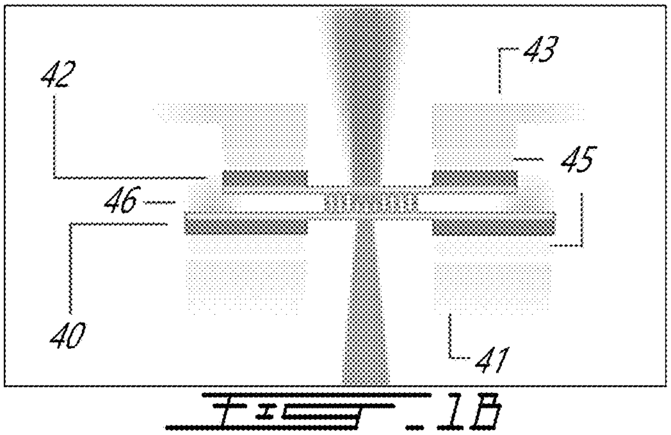
FIG. 1B is a schematical view of chips configuration according to an embodiment of an aspect of the present disclosure.
Figure 1C:
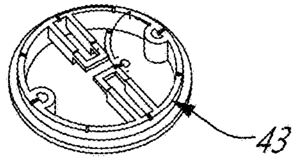
FIG. 1C shows a top chip holder according to an embodiment of an aspect of the present disclosure.
Figure 1D:
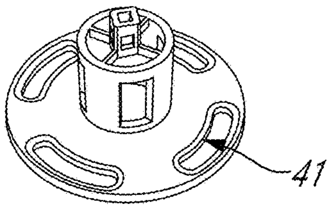
FIG. 1D is shows a bottom chip holder according to an embodiment of an aspect of the present disclosure.
Figure 1E:
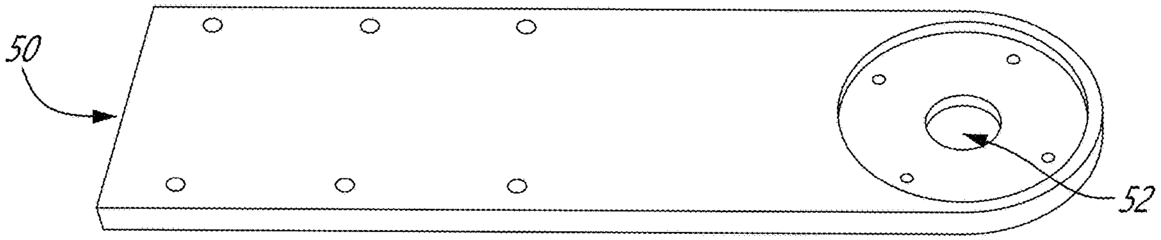
FIG. 1E is a perspective view of a plate positioning the top and bottom chips in the nano-positioning stage of FIG. 1A according to an embodiment of an aspect of the present disclosure.

The-positioning stages as illustrated comprise a 6-axis nano-positioning stage 32 (Thorlabs, MAX603D) selected for controlling the motion of a bottom chip 40 and a micro-positioning stage 34 selected for controlling the motion of a top chip 42 (see FIG. 1B); the top and bottom chips 42, 40 are positioned in a respective top chip holder 43 and bottom chip holder 41 (shown FIG. 1C and FIG. 1D respectively) and then in a facing relationship. A plate 50, shown in FIG. 1E, comprising an aperture 52 is positioned with the bottom chip 40 thereon in the nano-positioning stage 32 (see the circled horizontal plane in FIG. 1A). The micro-positioning stage 34 as illustrated comprises a four-axis rotation mount (Thorlabs, KS1RS) connected to XYZ translation stages (Keenso, SEMX80-AS) on a 95 mm rail 35 (Thorlabs, XT95SP-500) selected and configured to move the top chip holder 43 (FIG. 1C).

The sample support formed of the top and bottom chip holders 43, 41 was machined precisely according to the size of the top chip 42 (4×4 $mm^2$) and the size of the bottom chip 40 (5×5 $mm^2$), in aluminum using a 3D printer for example. The top chip 42 was glued to a bottom surface of the top chip holder 43 using double-sided adhesive 45, and the bottom chip 40 was glued to a top surface of the bottom chip holder 41 using low-viscosity double-sided adhesive 46, such as UV glue for example (see FIG. 1B). The adhesives to glue the FZP chips together are selected so as not to interfere with the beams on the chips plane (see the circled horizontal plane in FIG. 1B), and to maintain the system's numerical aperture to clearly image each grating used in the FZP chips, of pitches of about 2 μm and with the objective lens of numerical aperture of about 0.3.

Figure 2A:
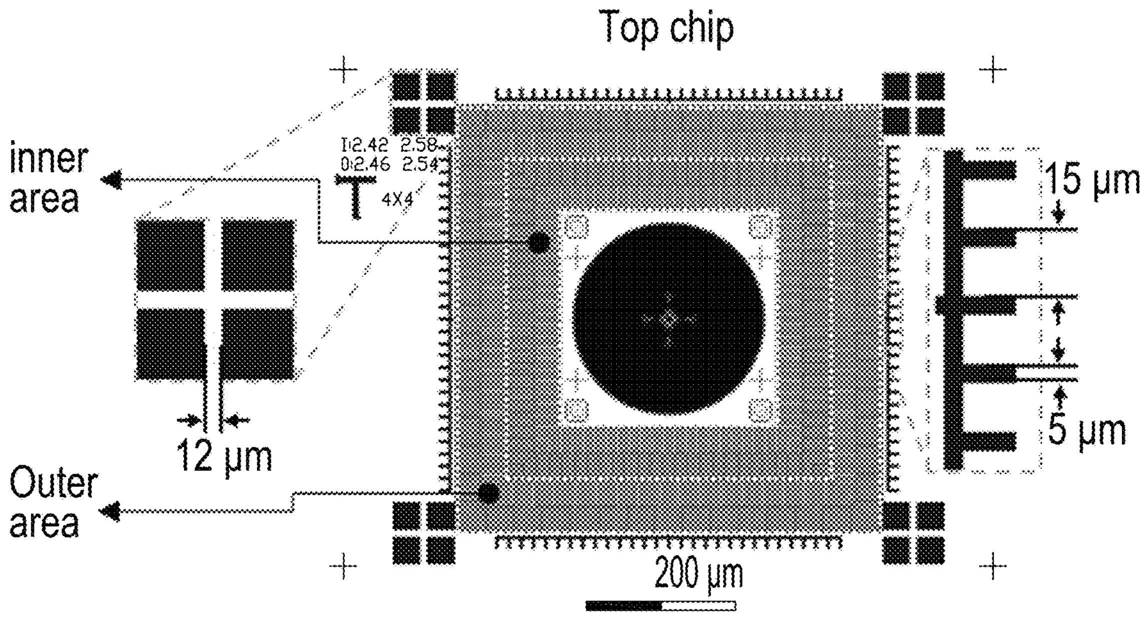
FIG. 2A shows top chip configuration according to an embodiment of an aspect of the present disclosure.
Figure 2B:
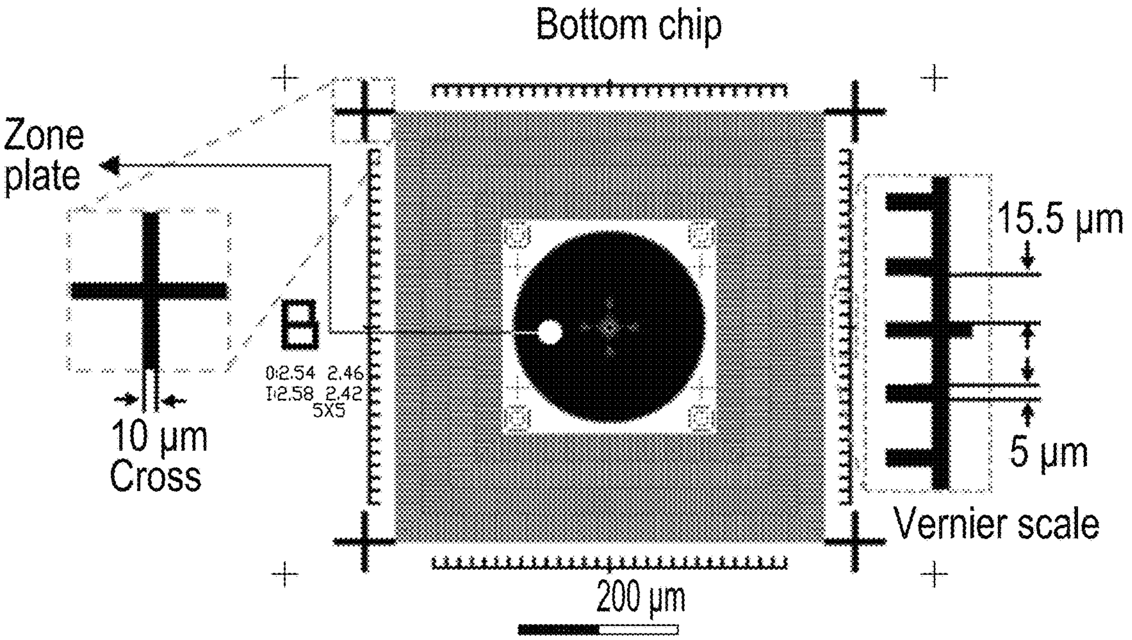
FIG. 2B shows bottom chip configuration according to an embodiment of an aspect of the present disclosure.
Figure 3B:
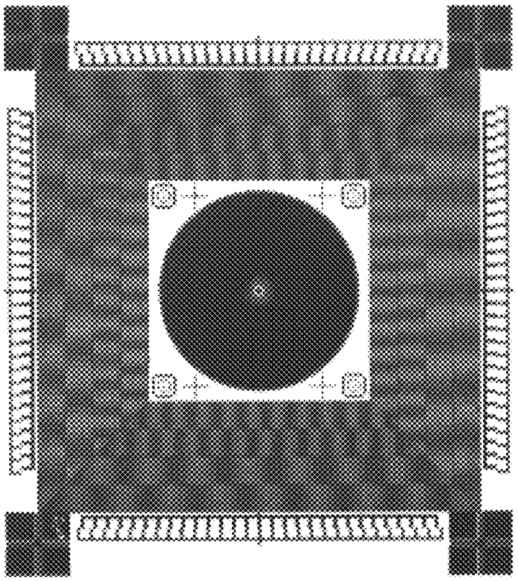
FIG. 3B shows misaligned chips according to an embodiment of an aspect of the present disclosure.
Figure 3C:
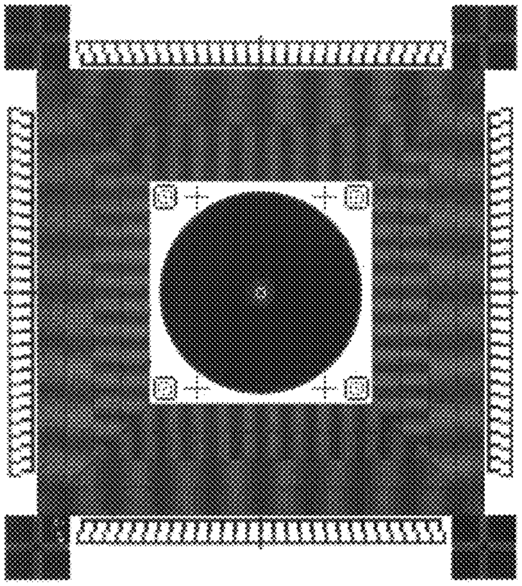
FIG. 3C shows aligned chips according to an embodiment of an aspect of the present disclosure.
Figure 3A:
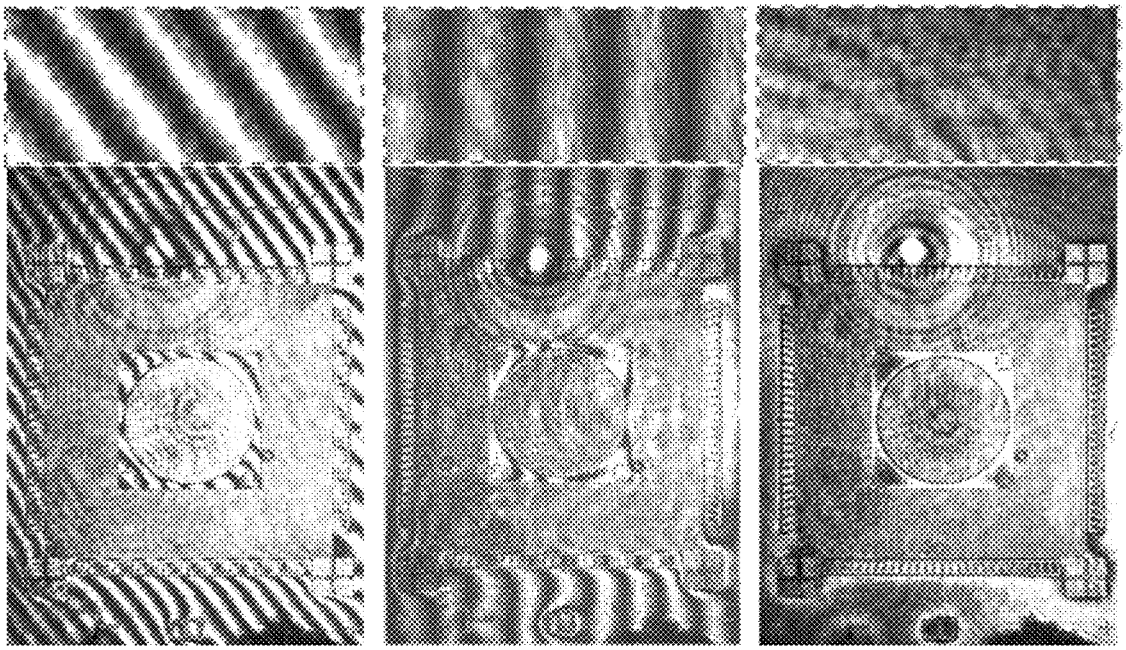
FIG. 3A shows images of parallelism under laser illumination according to an embodiment of an aspect of the present disclosure.
Figure 4A:
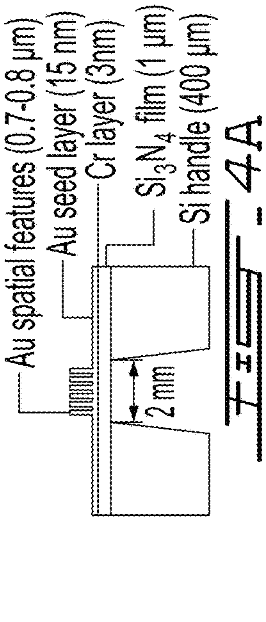
FIG. 4A is a side-view schematic.
Figure 4B:
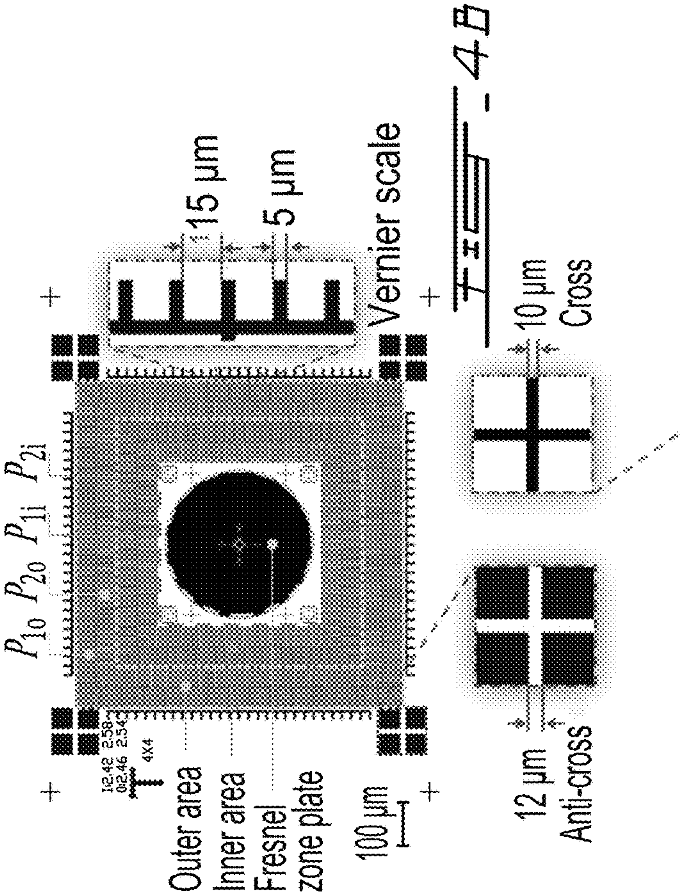
FIG. 4B is a top-view schematic of the designed patterns on the top FZP chip and FIG. 4C is a top-view schematic of the designed patterns on the bottom FZP chip, with $P_{1i}$, $P_{2i}$, $P_{1o}$, $P_{2o}$, periods of gratings in the inner and outer areas.
Figure 4C:
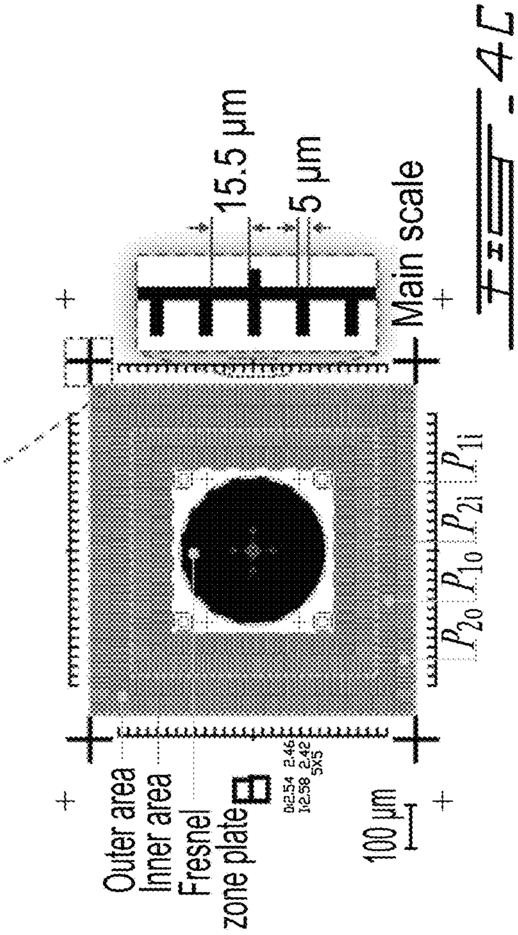
Figure 4D:
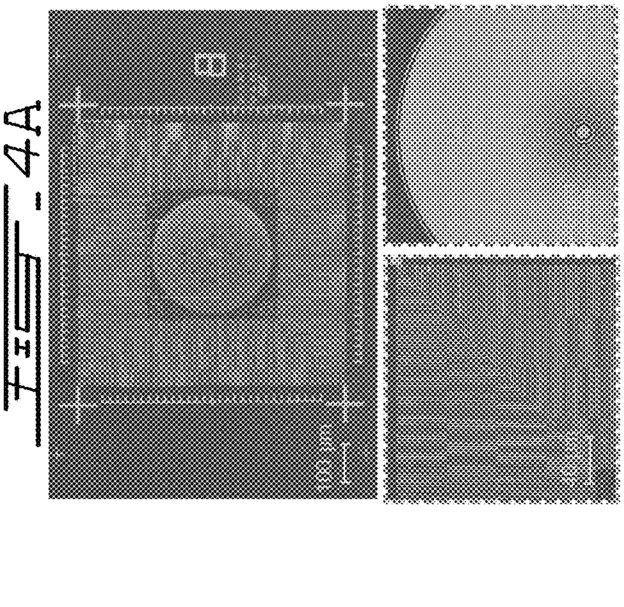
FIG. 4D shows scanning electron microscopy images of a fabricated bottom FZP chip with magnification ratios of 86× (top view) and two local areas marked by the blur and oranges boxes in the top image with the magnification ratio of 377× (bottom left view) and 383× (bottom right view.
Figure 4E:
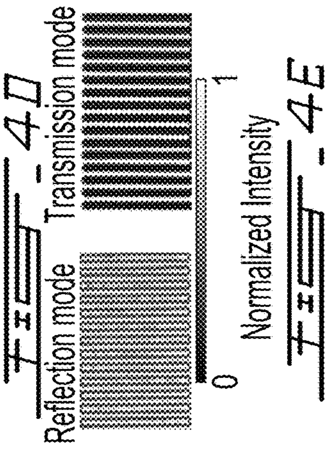
FIG. 4E shows optical microscopy images of a local area of the fabricated grating on the FZP chips in reflection mode (left) and transmission mode (right)
Figure 5A:
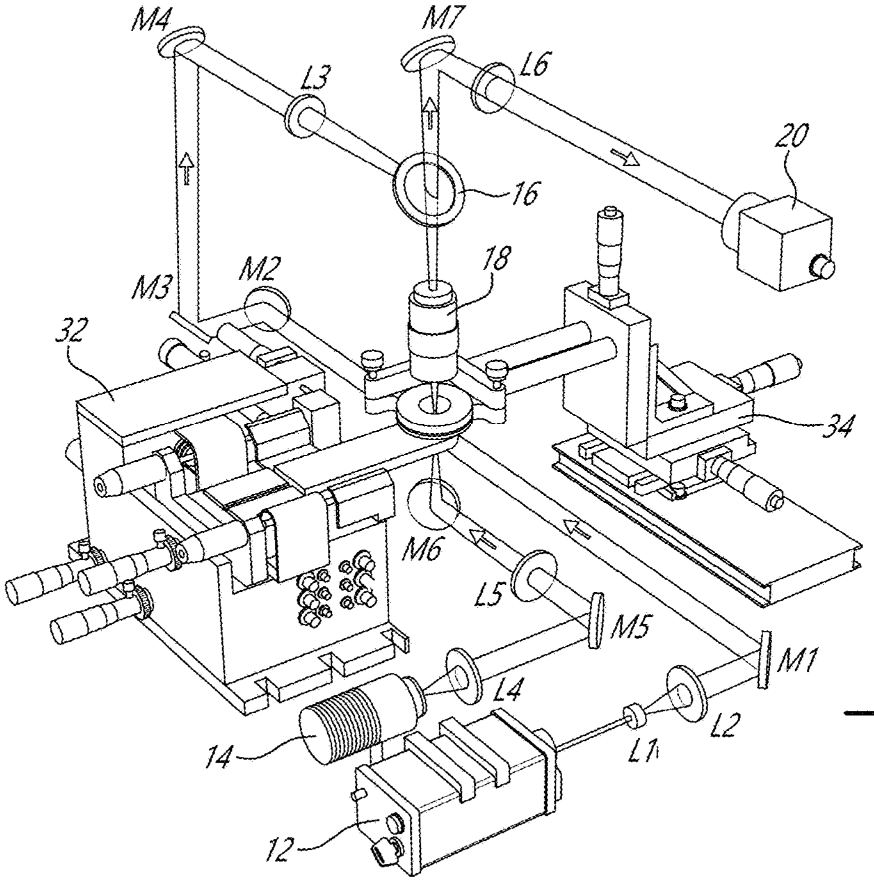
FIG. 5A is a system schematic view, with. L1-L6, lenses; M1-M7, mirrors.
Figure 5B:
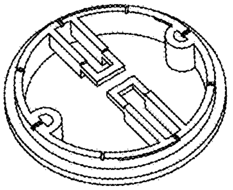
FIG. 5B shows the holders for the top chip.
Figure 5C:
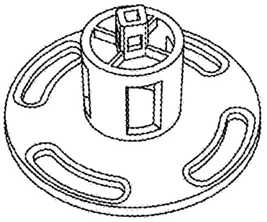
FIG. 5C shows the holders for the bottom chip.
Figure 5D:
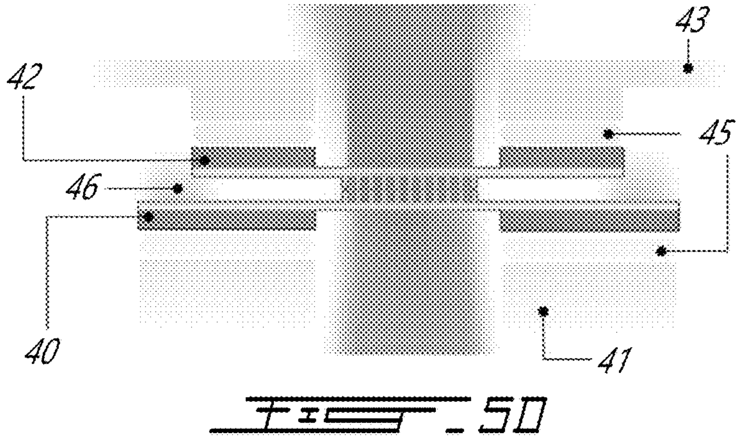
FIG. 5D is a side view of the chip holding configuration.
Figure 5E:
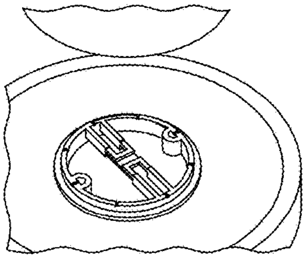
FIG. 5E shows the loaded top chip.
Figure 5F:
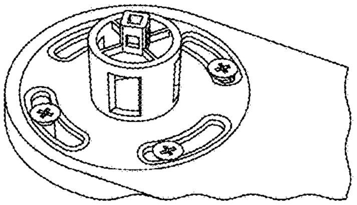
FIG. 5F shows the loaded bottom chip.
Figure 6A:
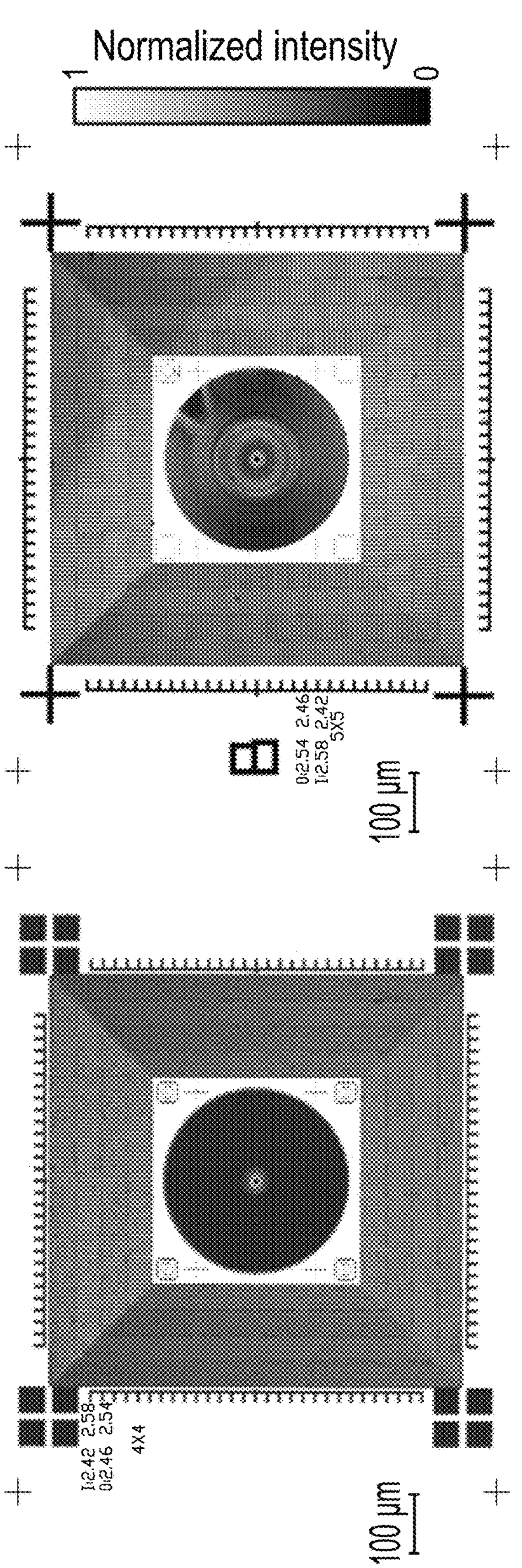
FIG. 6A shows images of the top (left handside) and bottom (right handside) chips under incoherent illumination.
Figure 6B:
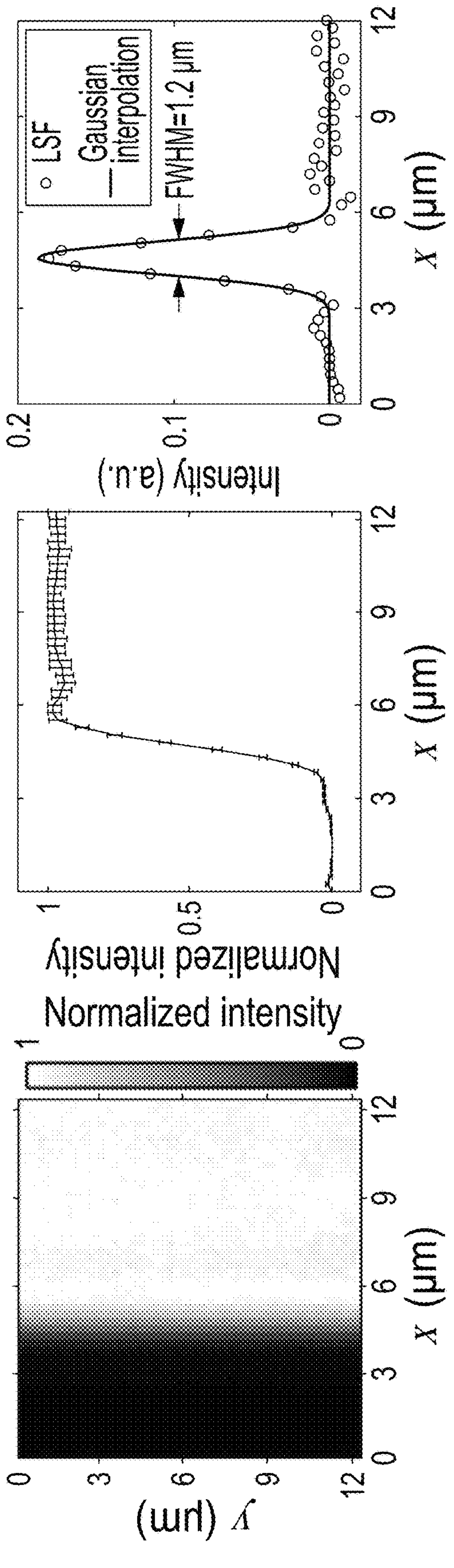
FIG. 6B shows an image of an edge (left panel) image of an edge; averaged edge spread function, with error bar: standard deviation (middle panel); line spread function with Gaussian interpolation; with FWHM, full width at half maximum (right panel)
Figure 8B:
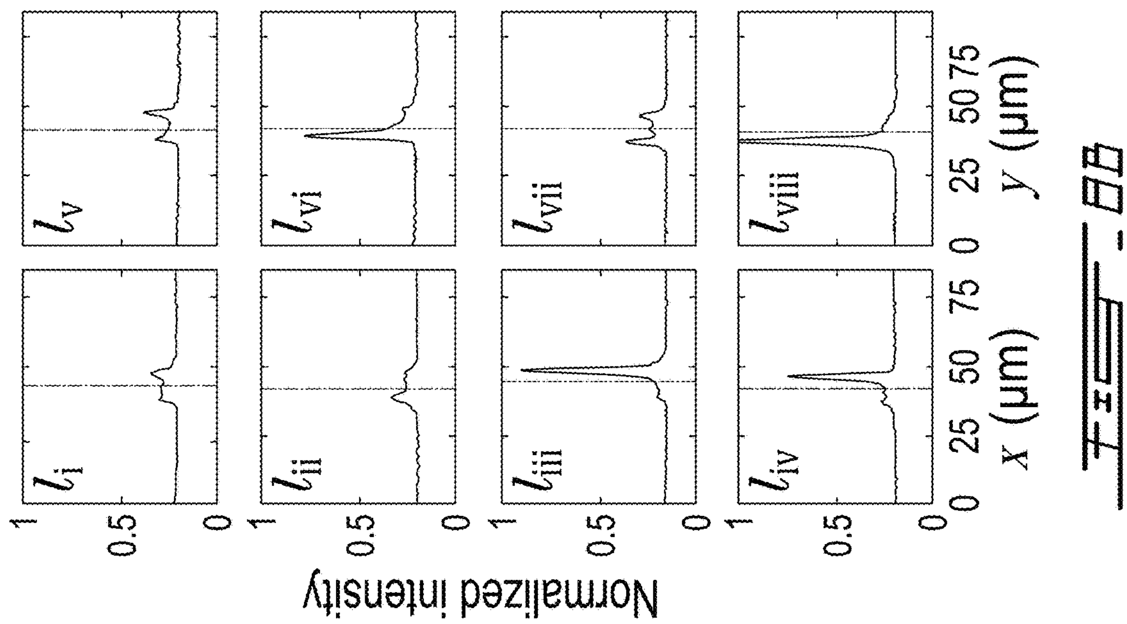
FIG. 8B shows analysis of line profiles $l_i$-$l_{viii}$.
Figure 8A:
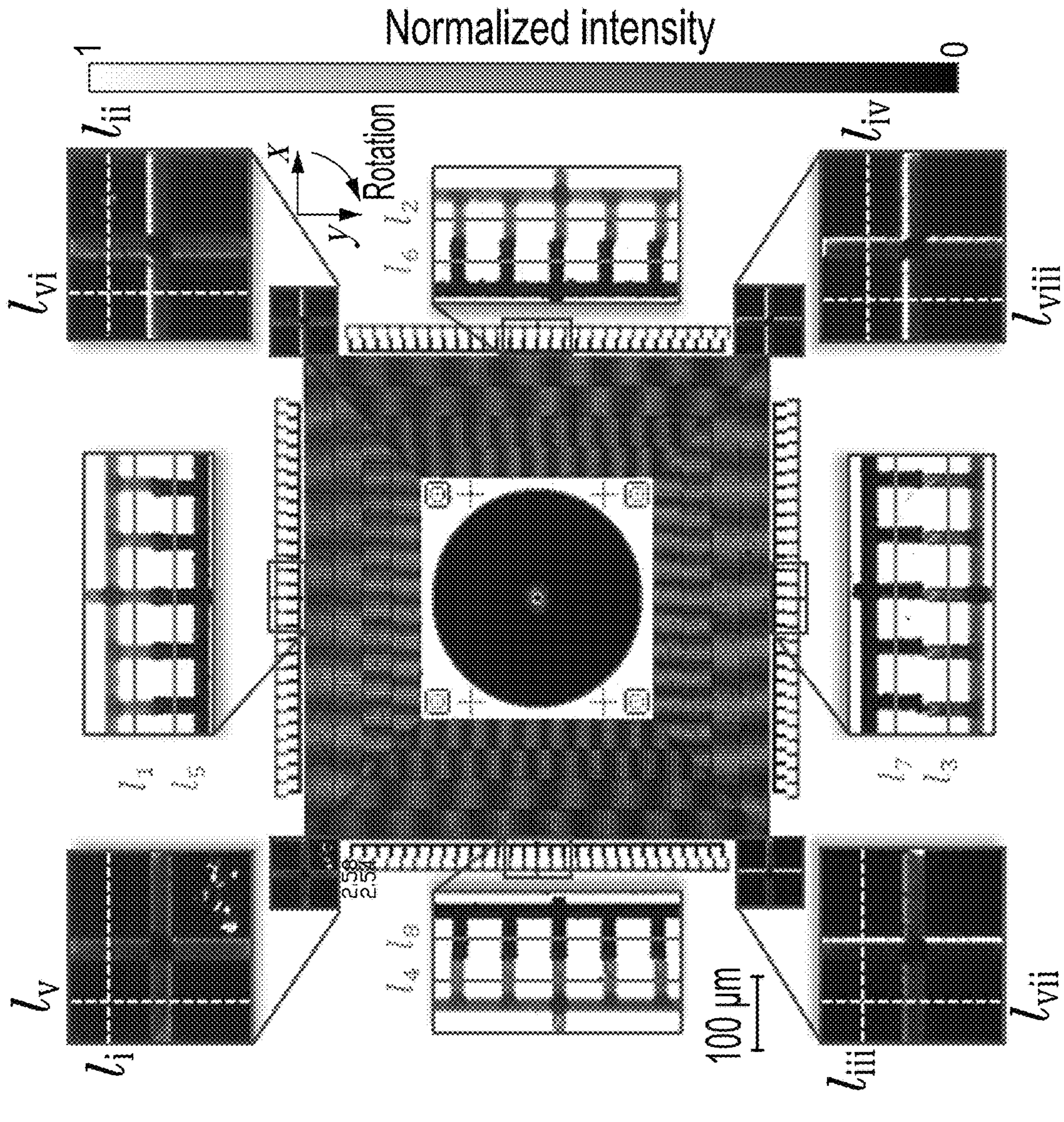
FIG. 8A is a representative image of two stacked FZP chips during the alignment, with $l_i$-$l_{viii}$:line profiles of the crosses and anti-crosses $l_1$-$l_4$:line profiles of the main scales; $l_5$-$l_8$:line profiles of the Vernier scales.
Figure 8C:
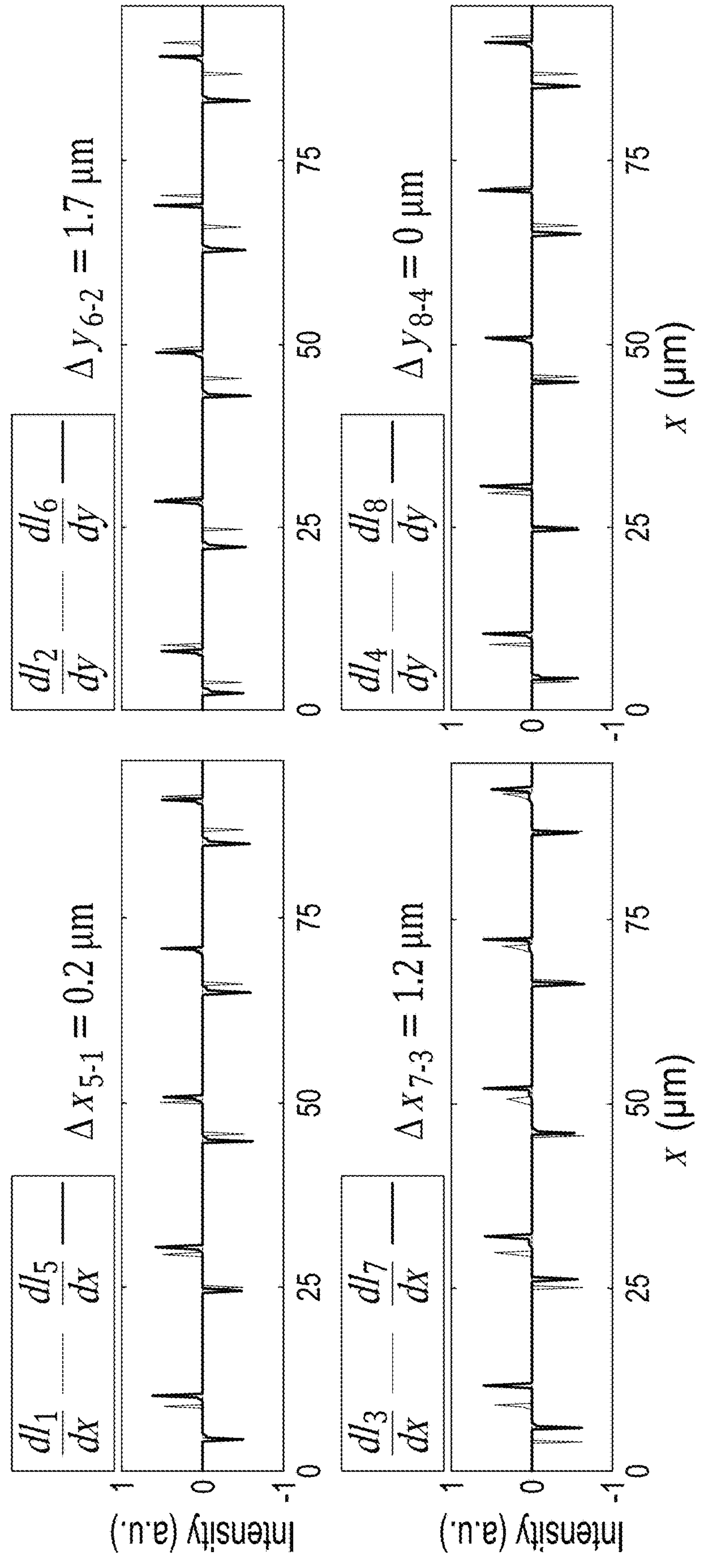
FIG. 8C shows analysis of spatial differentiation of the line profiles $l_1$-$l_8$ in pairs.
Figure 9A:
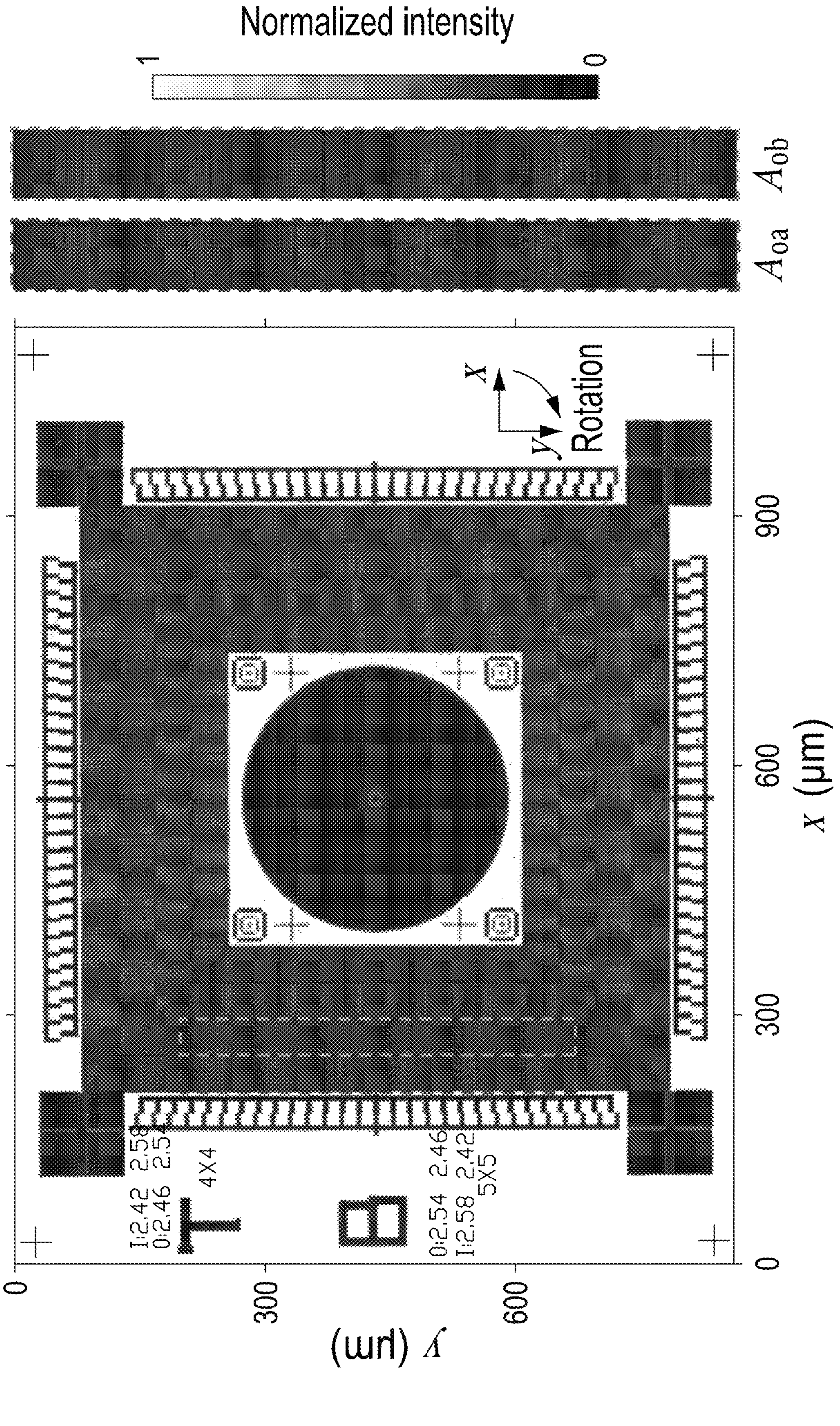
FIG. 9A shows two stacked chips during fine alignment, with insets: zoom-in views of two cropped grating areas $A_{oa}$ and $A_{ob}$ in the left region showing moiré fringes.
Figure 9B:
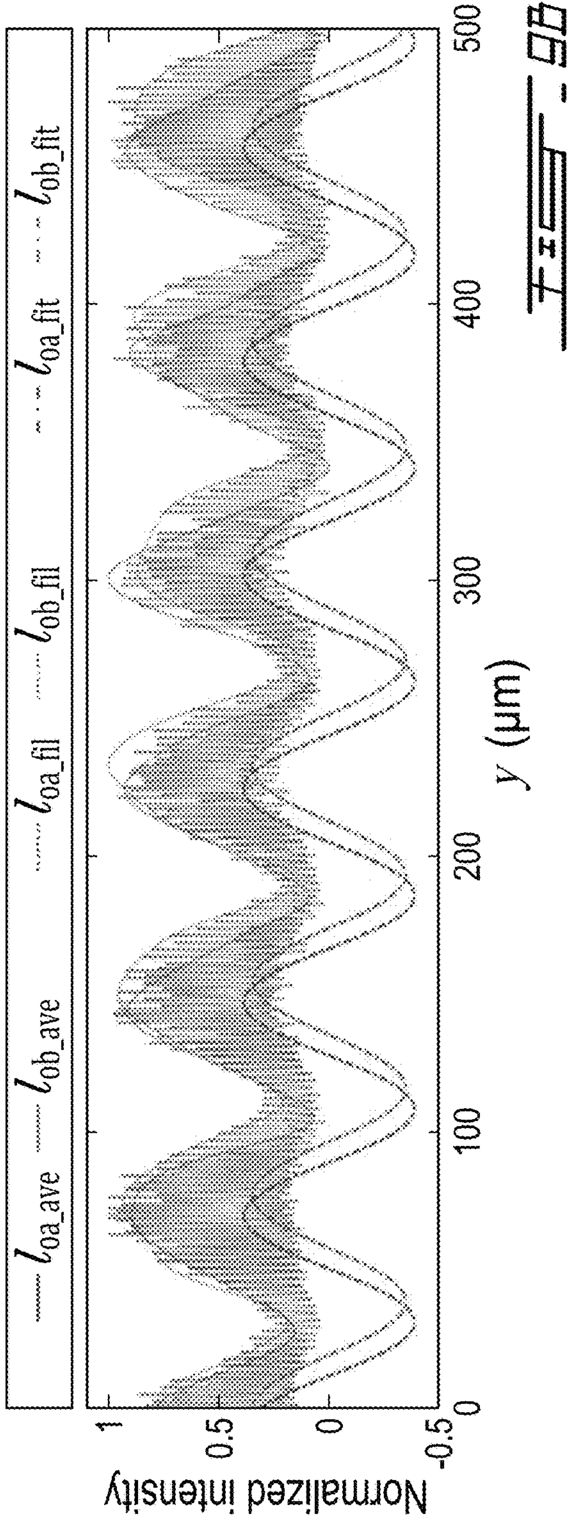
FIG. 9B shows line profiles used in the fine alignment analysis for the selected areas in FIG. 9A, with $l_{oa\_ave}$ and $l_{ob\_ave}$, averaged line profiles; $l_{oa\_fil}$ and $l_{ob\_fil}$, line profiles by low-pass-filtering $l_{oa\_ave}$ and $l_{ob\_ave}$; $l_{oa\_fit}$ and $l_{ob\_fit}$, line profiles by using sinusoidally fitting of $l_{oa\_fil}$ and $l_{ob\_fil}$ without the DC term.
Figure 9C:
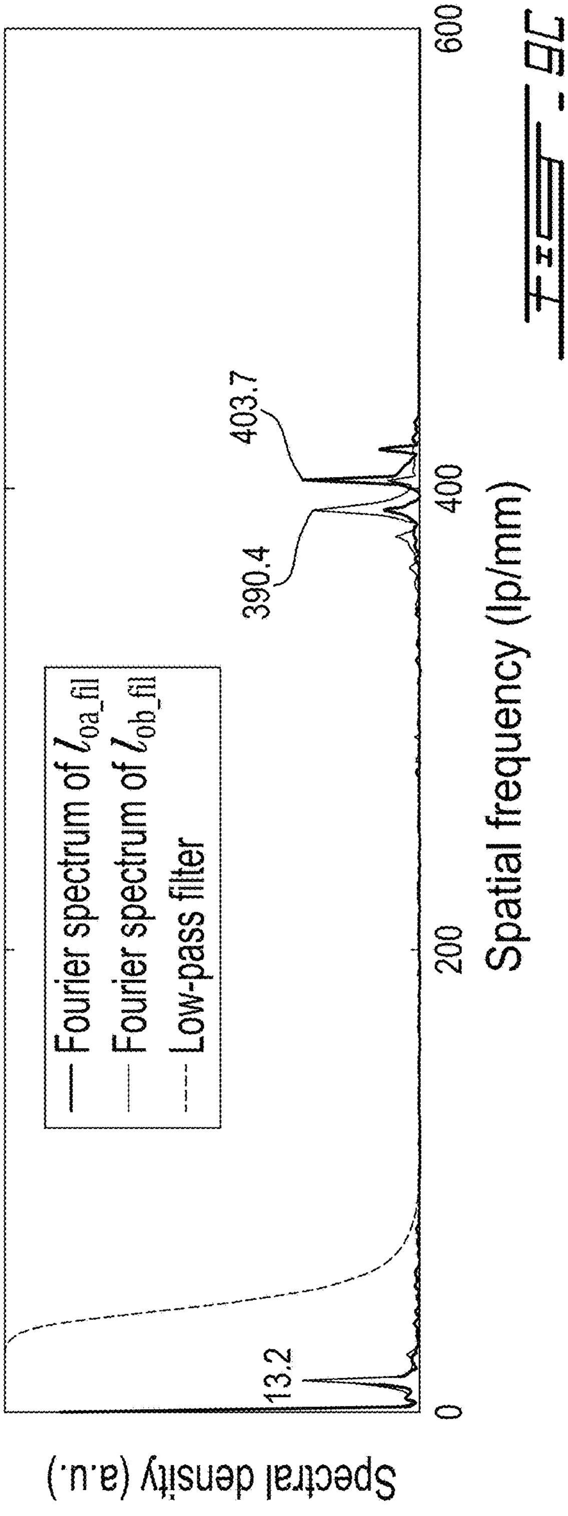
FIG. 9C shows Fourier spectra of $l_{oa\_fil}$ and $l_{ob\_fil}$ with the employed low-pass filter.
Figure 10B:
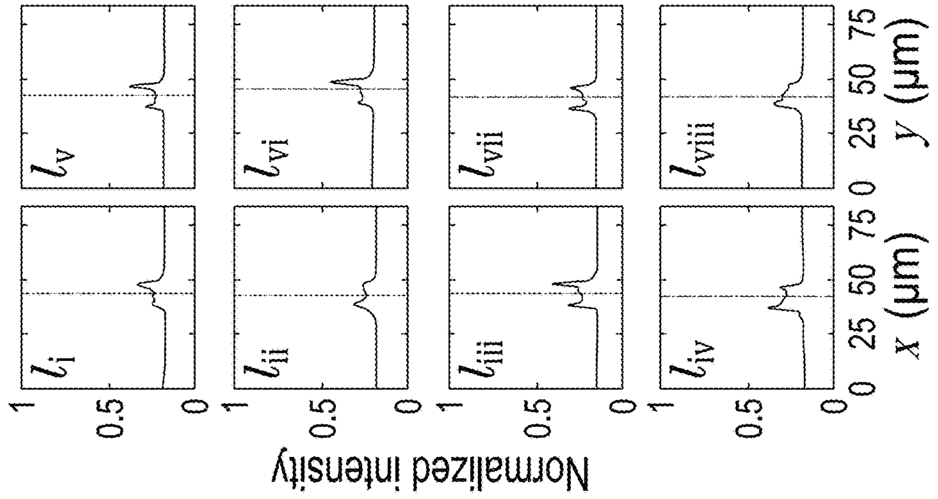
FIG. 10B shows cross-sections of the corner crosses.
Figure 10A:
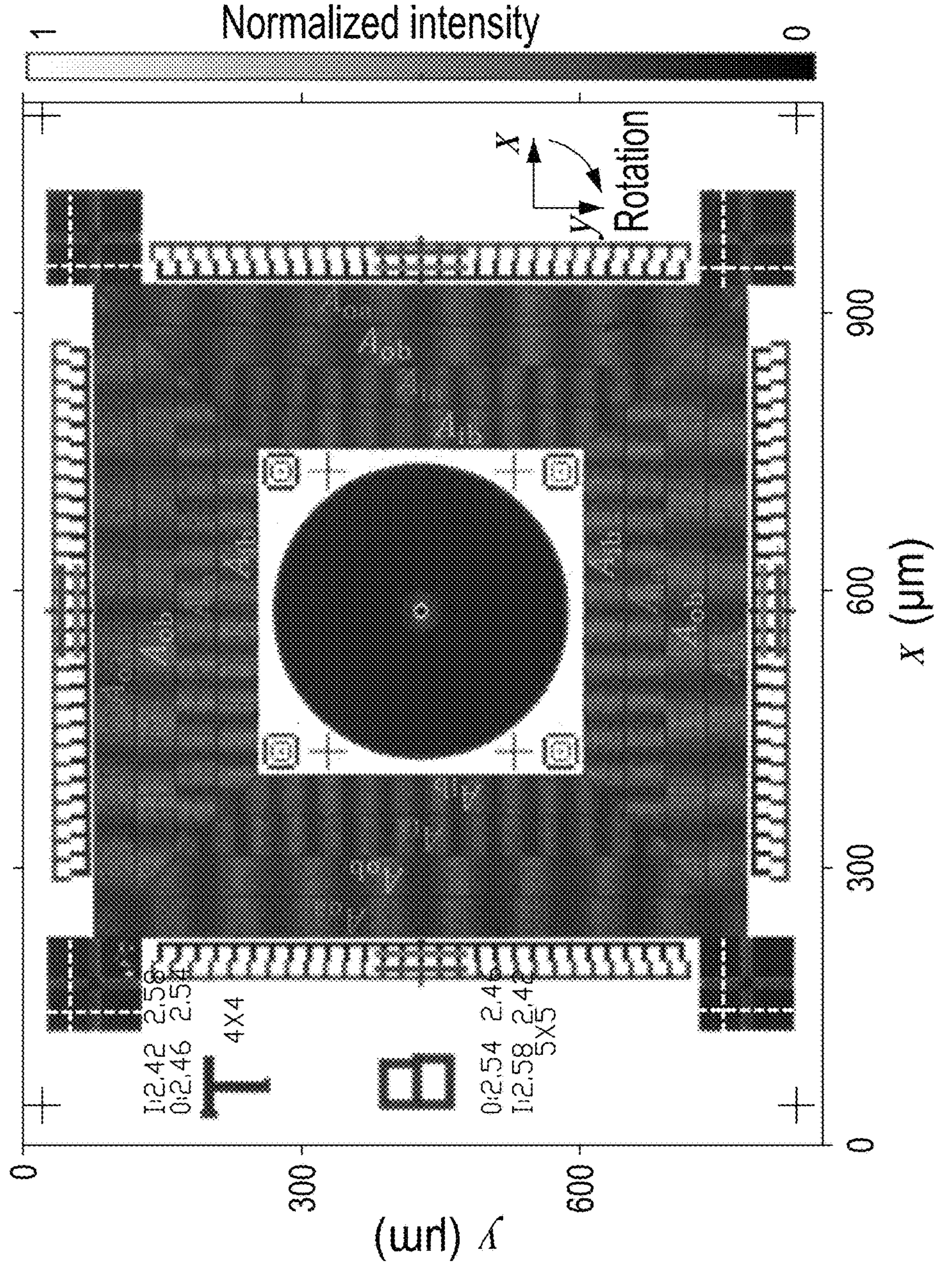
FIG. 10A shows two aligned chip images; $A_{ia}$ and $A_{ib}$ indicating the selected regions from the inner area for moiré fringe analysis.
Figure 10C:
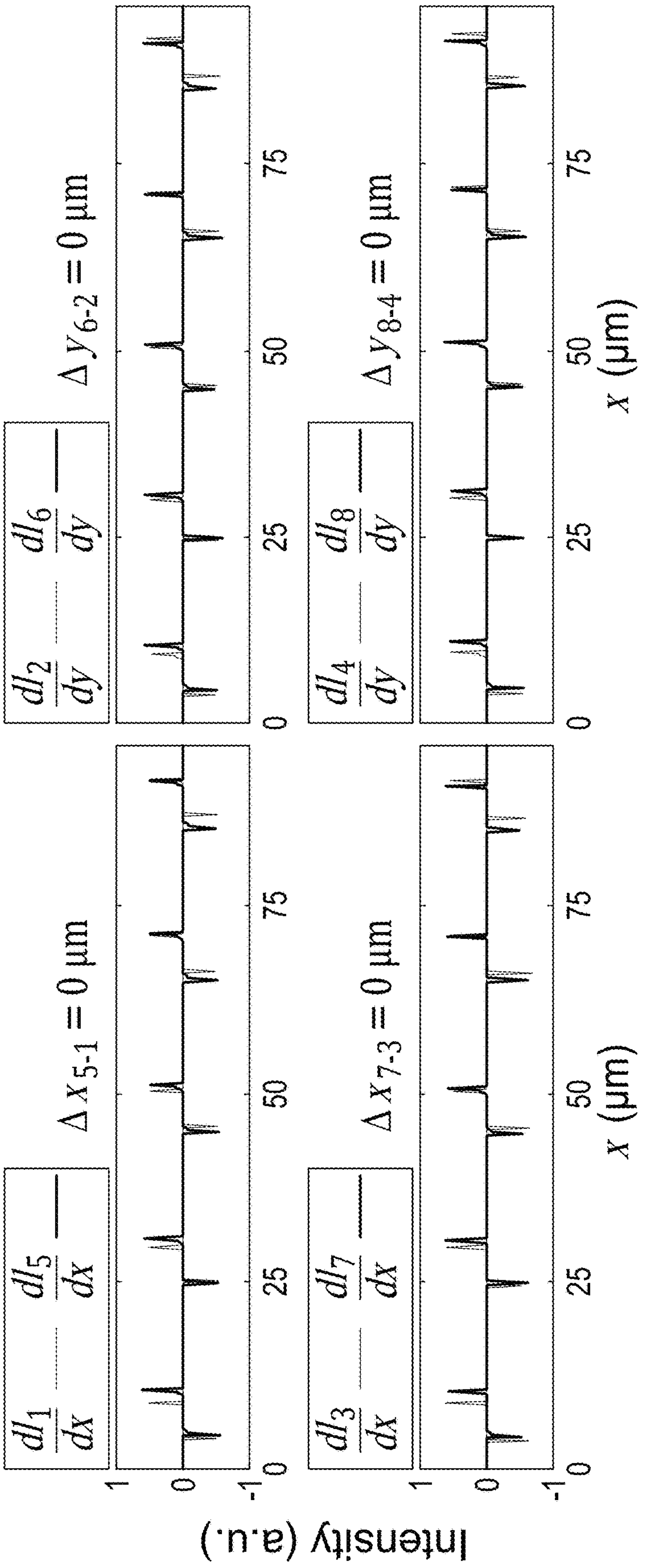
FIG. 10C shows spatial differentiation of the lines of main scales and the Vernier scales marked in FIG. 10A.
Figure 10D:
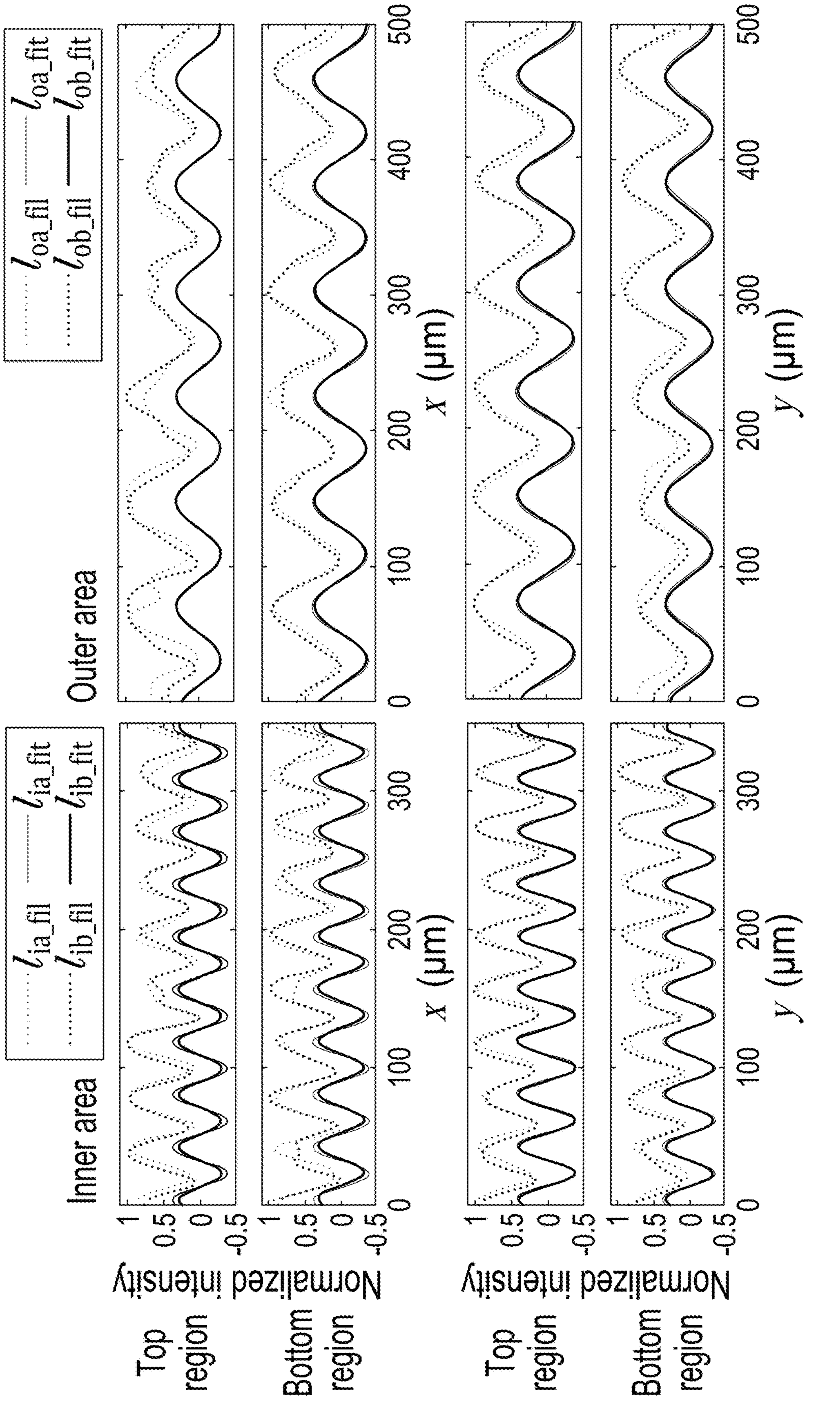
FIG. 10D shows fringes extractions of the inner and outer areas. $l_{ia\_fil}$, $l_{ib\_fil}$, $l_{ia\_fit}$, and $l_{ib\_fit}$ have the same meaning as $l_{oa\_fil}$, $l_{ob\_fil}$, $l_{oa\_fit}$, and $l_{ob\_fit}$ in FIG. 6 but are for selected regions from the inner area.
Figure 14A:
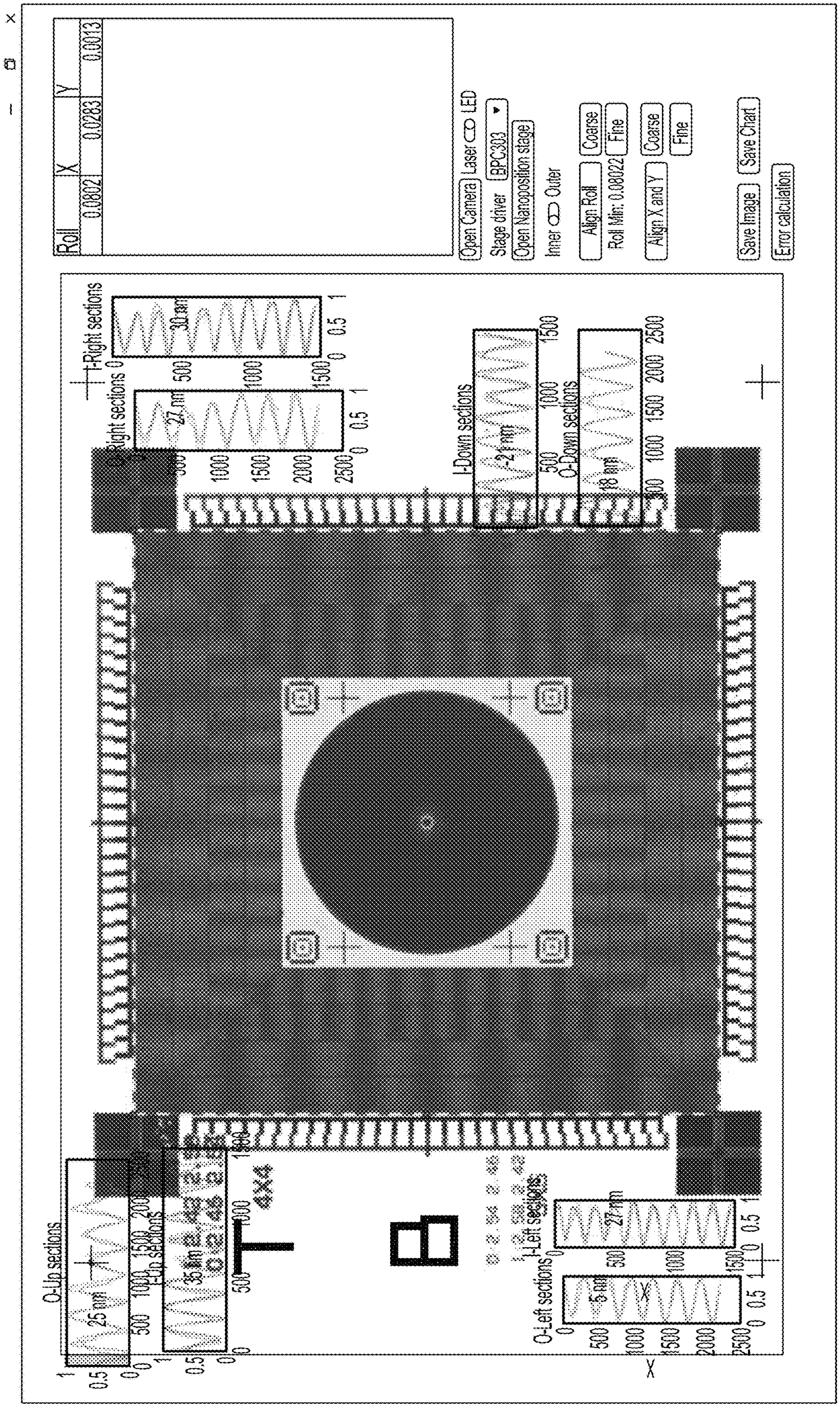
FIG. 14A shows the graphic user interface developed in Matlab.
Figure 14B:
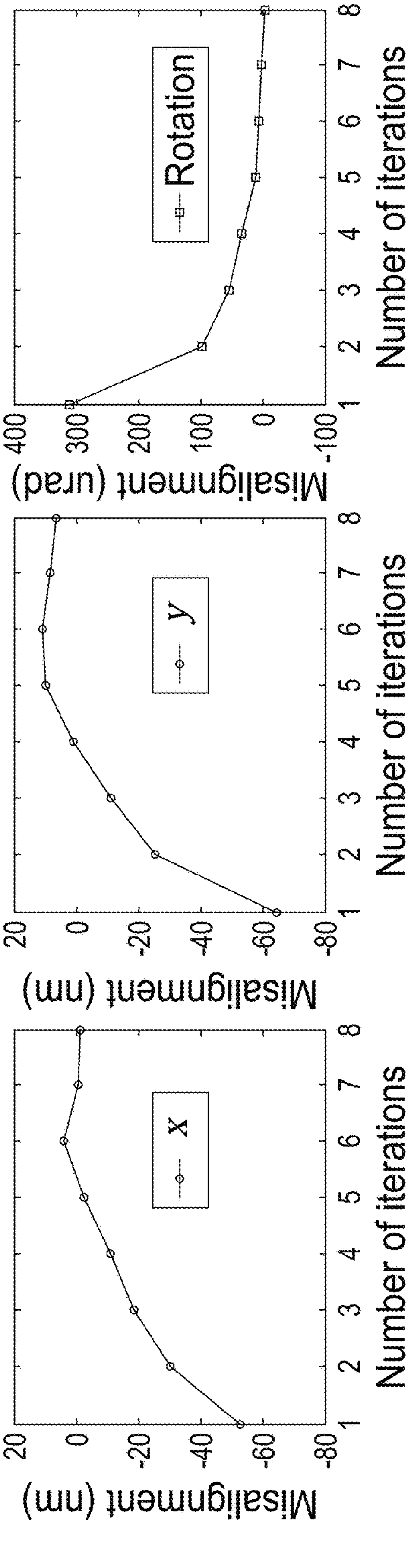
FIG. 14B shows convergence of misalignments in x, y, and rotation in an iterative alignment process.
Figure 15:
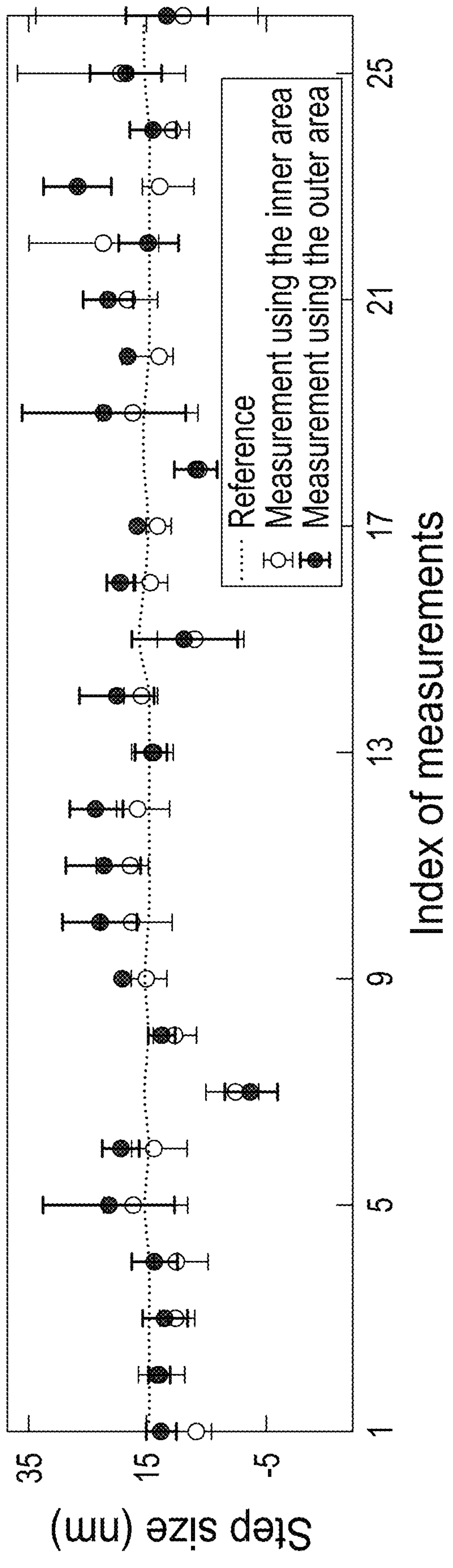
FIG. 15 shows the sensing capability of moiré fringes to 15-nm-step movement, with error bar: standard deviation.

FIG. 2A shows the top and bottom Fresnel zone plate (FZP) chip patterns according to an embodiment of an aspect of the present disclosure. Two FZPs (one marked in FIG. 2B), with a diameter of 310 μm and outermost zone width of 100 nm are placed in the center of the top and bottom chip patterns (see FIG. 2A). On the free space around the FZPs, there are two grating areas namely inner area and outer areas (both pointed out in FIG. 2A). Two sets of diffraction gratings with 2.42 and 2.58 μm period were fabricated aside in each four direction of the inner area, and two sets of diffraction gratings with 2.46 and 2.54 μm period were fabricated aside in each four directions of the outer area, and used as reference to minimize calculation error. In each direction of each area, the periods of two sets of grating on the top and bottom chips switched. The superimposed gratings with different periods at the distance of 10 μm, as at the bottom grating's Talbot distance, generate Moiré fringe patterns of 39 μm in the inner area, and of 78 μm in the outer area (see FIG. 3B). Before alignment, laser interferometry is performed to make the two chips parallel in pitch and yaw directions (see FIG. 3A). Alignment markers, indicated by corner crosses in FIG. 2A and Vernier scales indicated in FIG. 2B are used for linear misalignment under 0.5 μm and rotation misalignment under 0.5 μrad. For further alignment, linear and rotation misalignment of the two center FZPs on the top and bottom chips is obtained by calculating the relative displacement of two opposite directionally shifted moiré patterns in each direction. An image of misaligned chips is shown in FIG. 3B, and an image of aligned chips is shown in FIG. 3C. Moiré fringes are used to achieve an accuracy of about 30 nm in alignment between the two FZP, allowing maintaining ⅓ of FZP resolution (as outermost zone width) of 100 nm. Moiré fringes are used to achieve an accuracy of about 30 nm in alignment between the two FZP, allowing maintaining ⅓ of FZP resolution (as outermost zone width) of 100 nm. The method and the system, using a dual light source optical imaging, mechanical nano-positioning motion control, and precise support of the sample, thus shown to achieve high-precision alignment of the two chips, may be used to produce stacked FZP.

In the system, the laser 12 in the range between about 350 nm and about 900 nm, or a superluminescent diode or a laser diode for example, is selected to provide coherent illumination for laser interferometry and the light-emitting diode 14, or a superluminescent diode for example, is selected in the range between about 350 nm and about 900 nm to provide incoherent illumination for moiré-fringe generation, as the light source. The nano-positioning stage 32 is selected with x,y,z movement of at most 10 nm; and yaw, tilt and rotation movement of at most 1 μrad and the micro-positioning stage 34 is selected with x,y,z movement of at most 25 nm; and yaw, tilt and rotation movement of at most 0.1 degrees, to move the FZP chip in 6 degrees of freedom. The microscope with a long working-distance objective lens 18 selected with a spatial resolution of about 1 μm is used to image the FZP chips. Alignment markers on the FZP chips, with cross/anti-cross in the range between about 5 μm and about 15 and vernier/main scale in the range between about 10 μm and about 20, and gratings of a pitch in the range between about 1 μm and about 5 μm are used to guide the alignment process, as shown in FIG. 2. The images of the FZP chips are analysed for alignment using a computer software and resulting signals are transmitted to move the nanopositioning stage 32.

By integrating the dual light source into the system, parallelism may be achieved by using isotropic interference fringes generated by the reflection mode for pitch and yaw angle adjustment. The transmission mode LED provides bright field illumination while the x, y, and rotation alignments are performed.

The method comprises tilt-yaw alignment for adjusting and aligning the tilt and yaw of the FZP chips with tilt and yaw misalignments less than 0.3 mrad; coarse alignment for x, y, and rotation to adjust and align the x, y, and rotation of the FZP chip with misalignments in x and y within ±0.5 μm. The rotation misalignment within ±1.25 mrad, fine alignment for x, y, and rotation to adjust and align the x, y, and rotation of the FZP chip to misalignment reduced to ⅓ of the outmost ring width of the FZP chips (30 nm in the example illustrated herein.

The scope of the claims should not be limited by the embodiments set forth in the examples but should be given the broadest interpretation consistent with the description as a whole.

The invention claimed is:

1. A system of optical nanoscale alignment, comprising:
- a dual light source;
- a sample support;
- a positioning unit; and
- an imaging unit;
- wherein:
- the dual light source comprises a coherent light source and an incoherent light source; a first beam from the coherent light source being cast on a sample to a first surface thereof, a second beam from the incoherent light source being cast on the sample to a second, opposite, surface thereof;
- the sample support comprises a first holder for a first chip, and a second holder for a second chip; the first and second chips being positioned in the respective first and second chip holders in a facing relationship in contact with the first and second surfaces of the sample respectively;

the imaging unit comprises a microscope and an objective lens and captures images of the first and second chips;

the positioning unit comprises a micro-positioning stage controlling a movement of the first chip and a nano-positioning stage controlling a movement of the second chip, according to isotropic interference fringes generated by a reflection mode of the dual light source in images captured by the imaging unit, indicating of pitch and yaw angle, and light from the dual light source in transmission mode providing bright field illumination while x, y, and rotation alignments are performed.

2. The system of claim 1, wherein the coherent light source is one of a laser, a superluminescent diode and a laser diode; and the incoherent light source is one of a light-emitting diode and a laser diode.

3. The system of claim 1, wherein the first and second beams are in a range between 350 nm and 900 nm.

4. The system of claim 1, wherein the nano-positioning stage is selected for controlling x,y,z movements of at most 10 nm and yaw, tilt and rotation movements of at most 1 urad of the second chip; and the micro-positioning stage is selected for controlling x,y,z movements of at most 25 nm and yaw, tilt and rotation movements of at most 0.1 degrees of the first chip.

5. The system of claim 1, comprising a computer, wherein the computer determines a misalignment of the first and of the second chips in the images of the first and of the second chips and sends driving signals to the positioning unit to operate the positioning unit until a target alignment of the first and the second chips.

6. The system of claim 1, wherein the objective lens is a long working-distance objective lens.

7. The system of claim 1, wherein the imaging unit has a spatial resolution of about 1 μm.

8. The system of claim 1, wherein the first and of the second chips comprise alignment markers.

9. The system of claim 1, wherein the first and of the second chips comprise alignment markers, with ones of: crosses and anti-crosses in a range between 5 μm and 15 μm, vernier/main scale between 10 μm and 20 μm, and gratings with pitch between 1 μm and 5 μm.

10. A method of optical nanoscale alignment, comprising:

mounting a first chip supported by a first holder and a second chip supported by a second holder in a facing relationship in contact with a first and a second surfaces of a sample respectively;

providing a a micro-positioning stage and a nano-positioning stage controlling movements of the first and of the second chips respectively;

illuminating the first surface of the sample using a first light beam and the second surface of the sample with a second light beam of a dual light source;

capturing images of the first and second chips using a microscope and an objective lens;

monitoring tilt and yaw of the first and of the second chips to a misalignment of at most 0.3 mrad;

monitoring x and y directions and rotation of the first and of the second chips to a misalignment of ±0.5 μm in and of ±1.25 mrad respectfully; and monitoring the x and y directions and rotation of the first and of the second chips to a misalignment of an outermost ring of the chips, wherein the movements of the first chip and of the second chip are controlled by the micro-positioning stage and the nano-positioning stage respectively, according to isotropic interference fringes generated by a reflection mode of the dual light source in the images captured by the microscope and the objective lens, indicating of pitch and yaw angles, and light from the dual light source in transmission mode providing bright field illumination while x, y, and rotation alignments are performed.

11. The method of claim 10, wherein the dual light source comprises one of a laser, a superluminescent diode and a laser diode; and one of a light-emitting diode and a laser diode.

12. The method of claim 10, wherein the first and second light beams are in a range between 350 nm and 900 nm.

13. The method of claim 10, wherein the nano-positioning stage is selected for controlling x,y,z movements of at most 10 nm and yaw, tilt and rotation movements of at most 1 μrad of the second chip; and the micro-positioning stage is selected for controlling x,y,z movements of at most 25 nm and yaw, tilt and rotation movements of at most 0.1 degrees of the first chip.

14. The method of claim 10, comprising, using a computer, determining misalignment between the first chip and of the second chip in the images of the first and of the second chips and sending signals to the nano-positioning stage and the micro-positioning stage to operate the nano-positioning stage and the micro-positioning stage until a target alignment of the first and second chips.

15. The method of claim 10, wherein the objective lens is a long working-distance objective lens.

16. The method of claim 10, wherein the microscope and the objective lens have a spatial resolution of about 1 μm.

17. The method of claim 10, wherein the first and the second chips comprise alignment markers.

18. The method of claim 10, wherein the first and the second chips comprise alignment markers, with ones of: crosses and anti-crosses in a range between 5 μm and 15 μm, vernier/main scale between 10 μm and 20 μm, and gratings with pitch between 1 μm and 5 μm.

* * * * *